(12) United States Patent
Shin et al.

(10) Patent No.: US 11,705,454 B2
(45) Date of Patent: *Jul. 18, 2023

(54) ACTIVE REGIONS VIA CONTACTS HAVING VARIOUS SHAPED SEGMENTS OFF-SET FROM GATE VIA CONTACT

(71) Applicant: Samsung Electronics Co., Ltd., Suwon-si (KR)

(72) Inventors: Heonjong Shin, Yongin-si (KR); Sunghun Jung, Suwon-si (KR); Minchan Gwak, Hwaseong-si (KR); Yongsik Jeong, Suwon-si (KR); Sangwon Jee, Hwaseong-si (KR); Sora You, Cheonan-si (KR); Doohyun Lee, Hwaseong-si (KR)

(73) Assignee: Samsung Electronics Co, Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,357

(22) Filed: Jan. 24, 2022

(65) Prior Publication Data

US 2022/0149043 A1 May 12, 2022

Related U.S. Application Data

(63) Continuation of application No. 17/038,435, filed on Sep. 30, 2020, now Pat. No. 11,264,386, which is a (Continued)

(30) Foreign Application Priority Data

Aug. 31, 2018 (KR) ........................ 10-2018-0103505

(51) Int. Cl.
*H01L 21/768* (2006.01)
*H01L 23/485* (2006.01)
(Continued)

(52) U.S. Cl.
CPC .. *H01L 27/0924* (2013.01); *H01L 21/823821* (2013.01); *H01L 21/823828* (2013.01);
(Continued)

(58) Field of Classification Search
CPC ......... H01L 27/0924; H01L 21/823821; H01L 21/823828; H01L 21/823864;
(Continued)

(56) References Cited

U.S. PATENT DOCUMENTS 9,153,694 B2 10/2015 Xie et al.
9,461,143 B2 10/2016 Pethe et al.
(Continued)

FOREIGN PATENT DOCUMENTS

KR 10-2015-0033690 A 4/2015
KR 10-2016-0097869 A 8/2016
(Continued)

OTHER PUBLICATIONS

Notice of Allowance dated Oct. 15, 2020 in U.S. Appl. No. 16/391,757.

*Primary Examiner* — Herve-Louis Y Assouman
(74) *Attorney, Agent, or Firm* — Harness, Dickey & Pierce, P.L.C.

(57) ABSTRACT

A semiconductor device may include a substrate including an active pattern extending in a first direction, a gate electrode running across the active pattern and extending in a second direction intersecting the first direction, a source/drain pattern on the active pattern and adjacent to a side of the gate electrode, an active contact in a contact hole exposing the source/drain pattern, an insulating pattern filling a remaining space of the contact hole in which the active contact is provided, a first via on the active contact, and a second via on the gate electrode. The active contact may include a first segment that fills a lower portion of the
(Continued)

contact hole and a second segment that vertically protrudes from the first segment. The first via is connected to the second segment. The insulating pattern is adjacent in the first direction to the second via.

20 Claims, 34 Drawing Sheets

Related U.S. Application Data continuation of application No. 16/391,757, filed on Apr. 23, 2019, now Pat. No. 10,923,475.

(51) Int. Cl.
| | |
|---|---|
| H01L 23/528 | (2006.01) |
| H01L 29/417 | (2006.01) |
| H01L 27/02 | (2006.01) |
| H01L 23/48 | (2006.01) |
| H01L 23/522 | (2006.01) |
| H01L 27/092 | (2006.01) |
| H01L 29/78 | (2006.01) |
| H01L 29/66 | (2006.01) |
| H01L 21/8238 | (2006.01) |

(52) U.S. Cl.
CPC ........... H01L 21/823864 (2013.01); H01L 21/823871 (2013.01); H01L 23/5226 (2013.01); H01L 29/41775 (2013.01); H01L 29/6681 (2013.01); H01L 29/785 (2013.01); H01L 2029/7858 (2013.01)

(58) Field of Classification Search
CPC ......... H01L 21/823871; H01L 23/5226; H01L 29/41775; H01L 29/6681; H01L 29/785; H01L 2029/7858; H01L 21/76832; H01L 21/76834; H01L 21/76883; H01L 21/76897; H01L 23/485; H01L 23/5283; H01L 29/41791; H01L 27/0207; H01L 21/768; H01L 23/481; H01L 23/50; H01L 23/522; H01L 21/823814; H01L 21/76813; H01L 21/76816; H01L 21/76829; H01L 29/78

See application file for complete search history.

(56) References Cited

U.S. PATENT DOCUMENTS

| | | | |
|---|---|---|---|
| 9,536,968 | B2 | 1/2017 | Park et al. |
| 9,735,242 | B2 | 8/2017 | Xie et al. |
| 9,984,886 | B2 | 5/2018 | Kim et al. |
| 10,923,475 | B2 | 2/2021 | Shin et al. |
| 11,264,386 | B2 * | 3/2022 | Shin ................ H01L 29/785 |
| 2007/0243671 | A1 | 10/2007 | Liaw |
| 2011/0042752 | A1 | 2/2011 | Mayuzumi |
| 2013/0328131 | A1 | 12/2013 | Lu et al. |
| 2014/0001568 | A1 | 1/2014 | Wang et al. |
| 2014/0077305 | A1 | 3/2014 | Pethe et al. |
| 2015/0012798 | A1 | 1/2015 | Resch et al. |
| 2016/0126326 | A1 | 5/2016 | Park et al. |
| 2016/0233164 | A1 | 8/2016 | Choi et al. |
| 2016/0284806 | A1 | 9/2016 | Park et al. |
| 2016/0308008 | A1 | 10/2016 | Yeo et al. |
| 2016/0322304 | A1 | 11/2016 | Kim et al. |
| 2017/0110549 | A1 | 4/2017 | Xie et al. |
| 2018/0012798 | A1 | 1/2018 | Labonte et al. |
| 2018/0061753 | A1 | 3/2018 | Chang et al. |
| 2018/0102364 | A1 | 4/2018 | Rastogi |
| 2018/0130796 | A1 | 5/2018 | Jun et al. |

FOREIGN PATENT DOCUMENTS

| | | |
|---|---|---|
| KR | 10-2016-0114223 A | 10/2016 |
| KR | 10-2018-0025292 A | 3/2018 |
| WO | WO-2014/004770 A2 | 1/2014 |

* cited by examiner

US 11,705,454 B2

ACTIVE REGIONS VIA CONTACTS HAVING VARIOUS SHAPED SEGMENTS OFF-SET FROM GATE VIA CONTACT

CROSS-REFERENCE TO RELATED APPLICATION

This application is a continuation of U.S. application Ser. No. 17/038,435, filed on Sep. 30, 2020, which is a continuation of U.S. application Ser. No. 16/391,757, filed on Apr. 23, 2019, which claims priority under 35 U.S.C. § 119 to Korean Patent Application No. 10-2018-0103505 filed on Aug. 31, 2018 in the Korean Intellectual Property Office, the entire contents of each of which are hereby incorporated by reference.

BACKGROUND

The present inventive concepts relate to a semiconductor device, and more particularly, to a semiconductor device including a field effect transistor and a method of manufacturing the same.

Semiconductor devices are beneficial in electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of electronic industry. For example, semiconductor devices have been increasingly requested for high reliability, high speed, and/or multi-functionality. Semiconductor devices are gradually complicated and integrated to meet these requested characteristics.

SUMMARY

Some example embodiments of the present inventive concepts provide a semiconductor device with increased integration and reliability.

According to some example embodiments of the present inventive concepts, a semiconductor device may include a substrate including an active pattern extending in a first direction; a gate electrode extending across the active pattern in a second direction, the second direction intersecting the first direction; a source/drain pattern on the active pattern such that the source/drain pattern is adjacent to a side of the gate electrode; an active contact including a first segment and a second segment, the first segment of the active contact being in a first portion of a contact hole, the contact hole exposing the source/drain pattern, the second segment of the active contact vertically protruding from the first segment; an insulating pattern filling a second portion of the contact hole; a first via on the active contact and connected to the second segment of the active contact; and a second via on the gate electrode such that the insulating pattern is adjacent in the first direction to the second via.

According to some example embodiments of the present inventive concepts, a semiconductor device may include a substrate including a plurality of active patterns extending in parallel along a first direction; a gate electrode extending in a second direction across the active patterns, the second direction intersecting the first direction; a source/drain pattern on the active patterns such that the source/drain pattern is adjacent to a side of the gate electrode; an active contact including a first segment and a second segment, the first segment of the active contact being on the source/drain pattern and the second segment vertically protruding from the first segment; a first via on the second segment; and a second via on the gate electrode such that the second via vertically overlaps at least one of the active patterns.

According to some example embodiments of the present inventive concepts, a semiconductor device may include a substrate including a plurality of active patterns extending in parallel along a first direction; a gate electrode extending in a second direction across the active patterns, the second direction intersecting the first direction; a source/drain pattern on the active patterns such that the source/drain pattern is adjacent to a side of the gate electrode; and an active contact including a first segment and a second segment, the first segment of the active contact being on the source/drain pattern and the second segment of the active contact vertically protruding from the first segment, the active contact being shaped such that a width in the second direction of the second segment of the active contact increases towards the substrate.

DETAILED DESCRIPTION OF EMBODIMENTS

Figure 1:
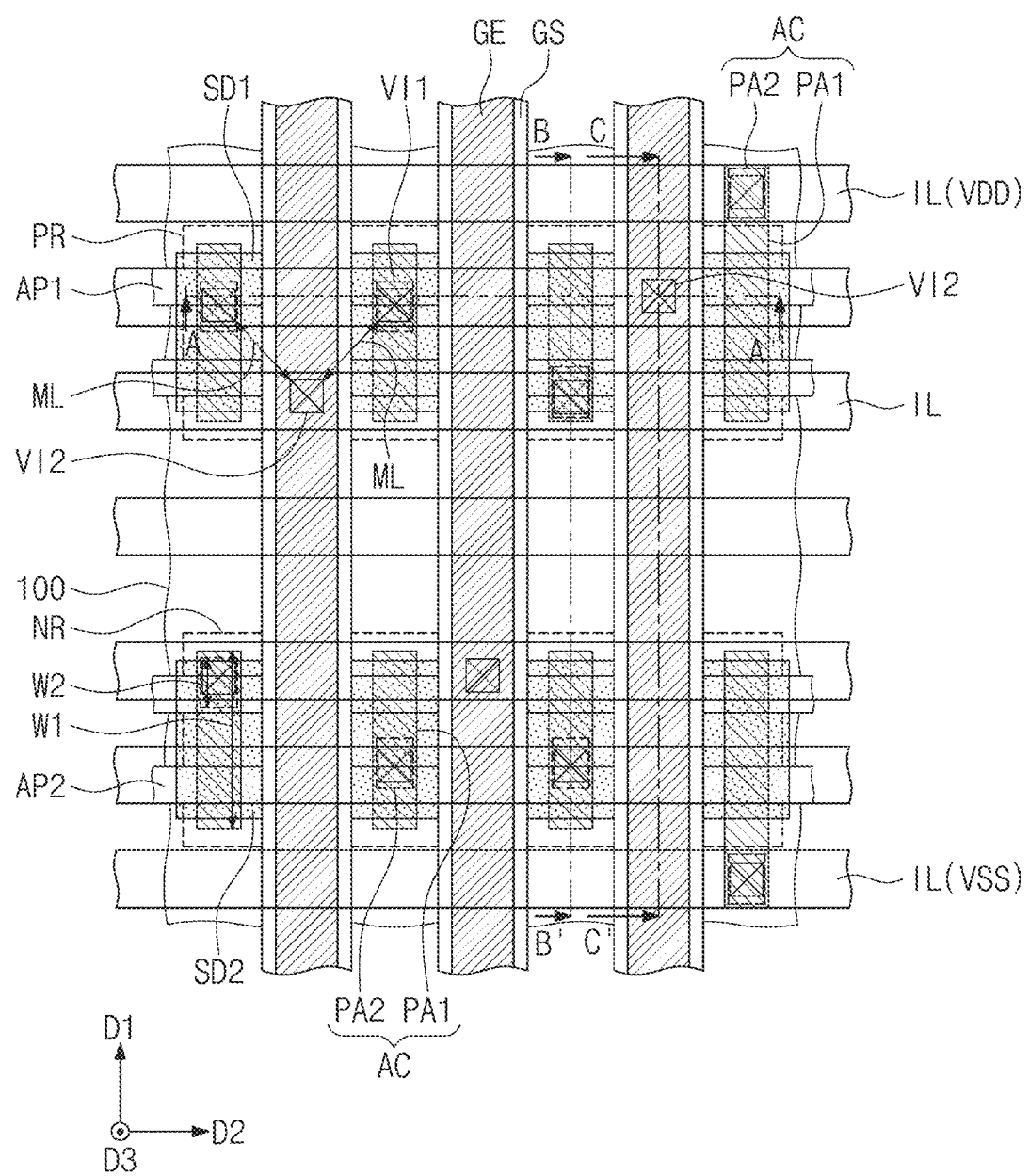
FIG. 1 illustrates a plan view showing a semiconductor device according to some example embodiments of the present inventive concepts.
Figure 2A:
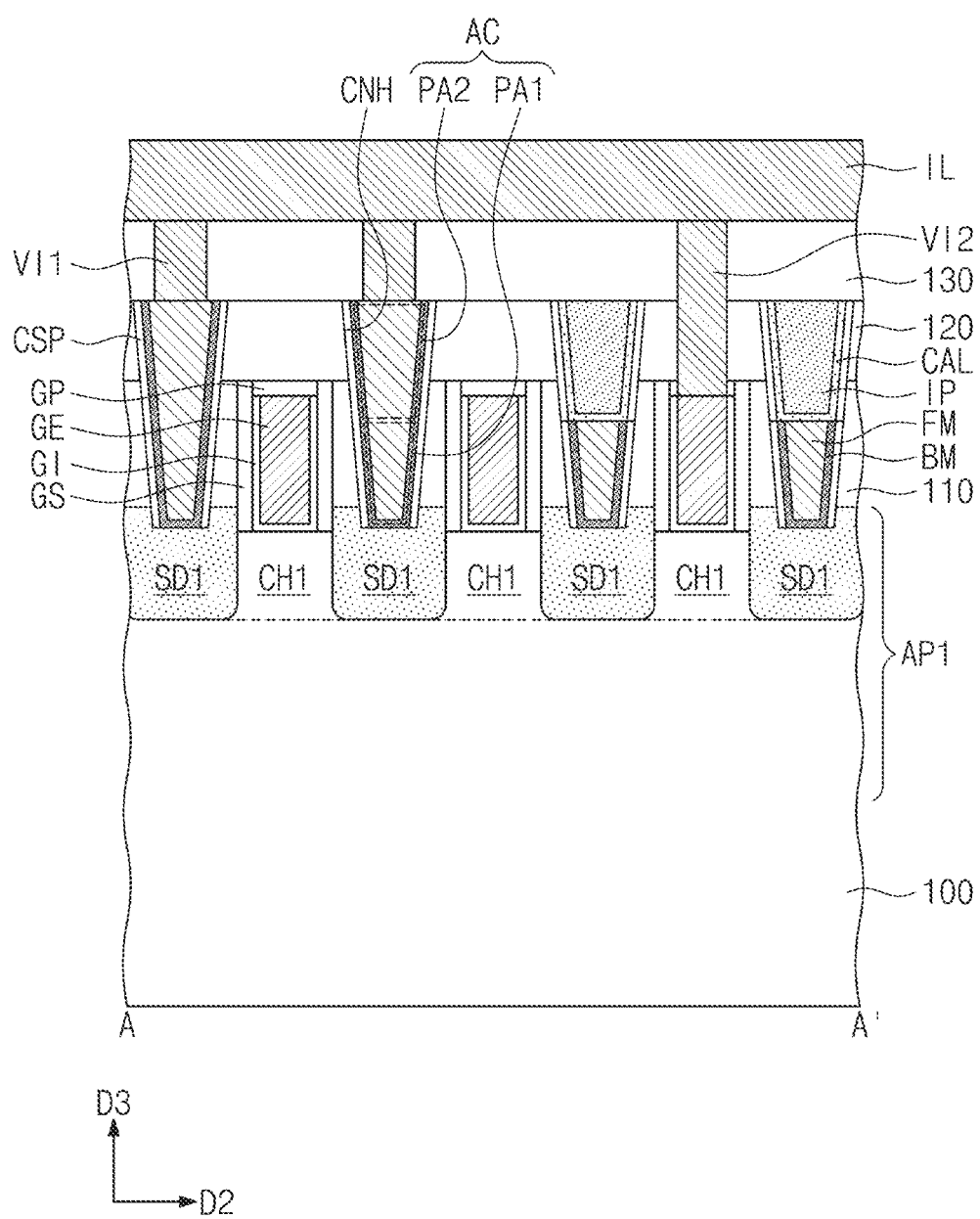
FIGS. 2A, 2B, and 2C illustrate cross-sectional views respectively taken along lines A-A', B-B', and C-C' of FIG. 1.
Figure 2B:
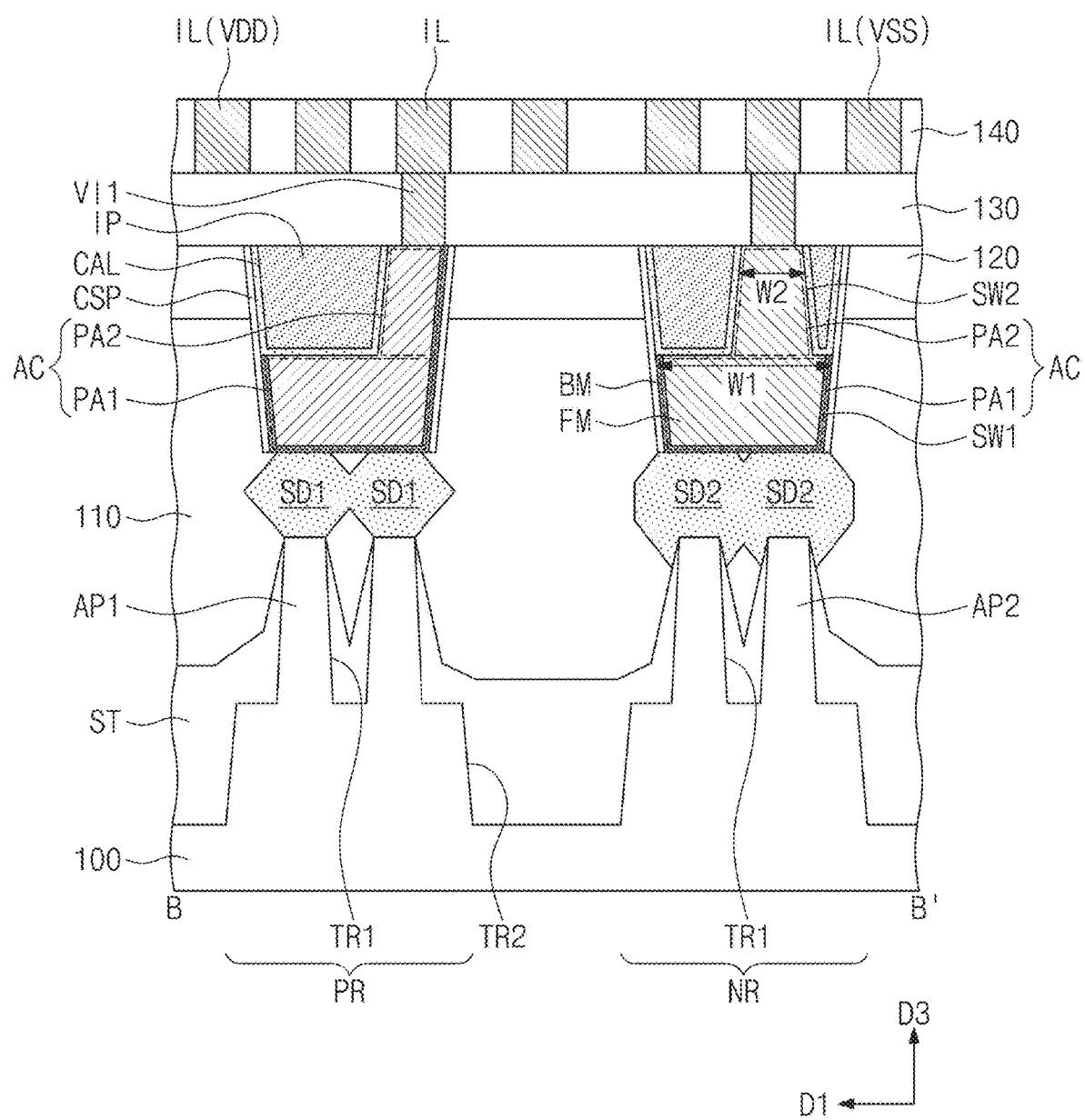
Figure 2C:
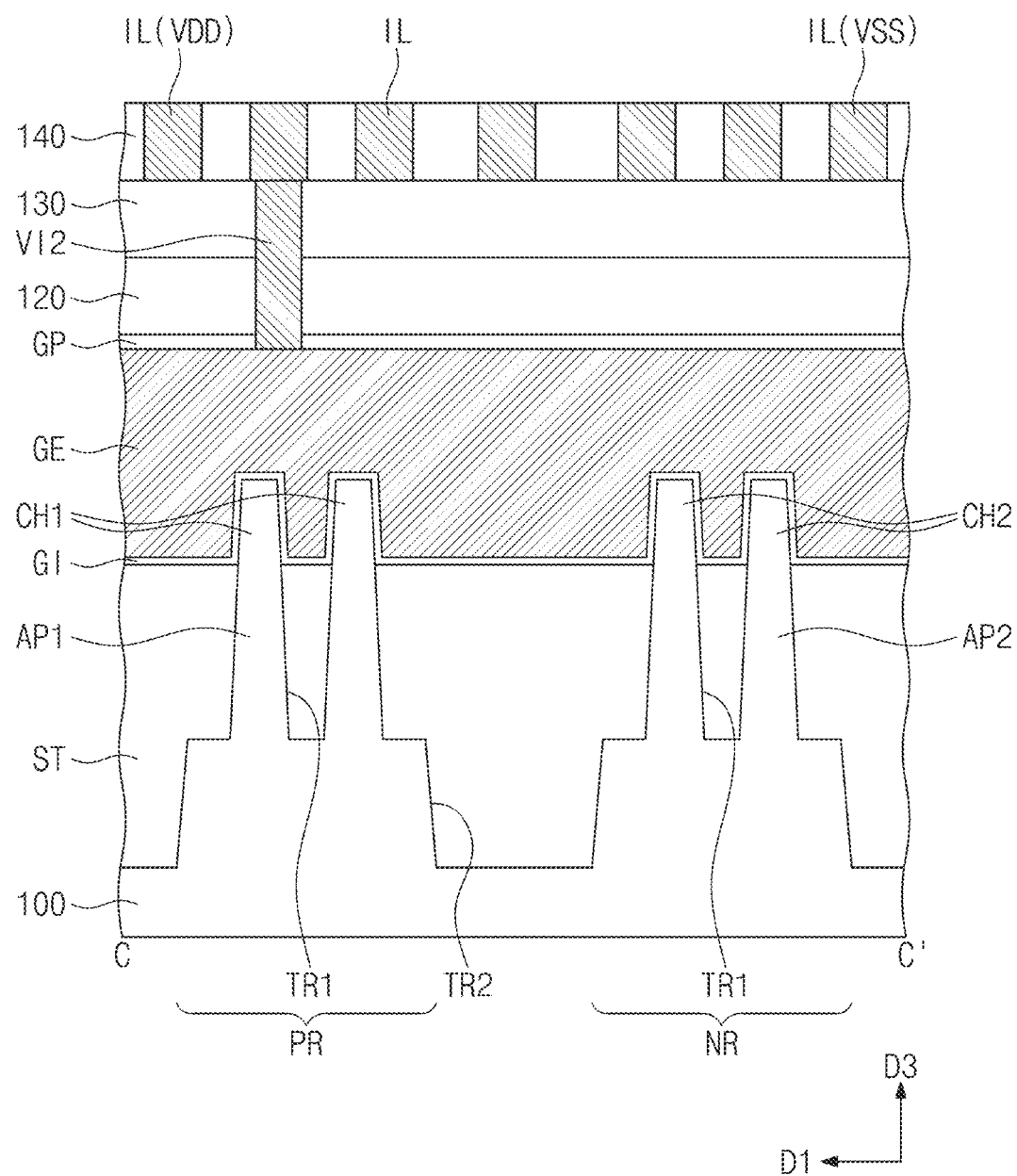
Figure 3:
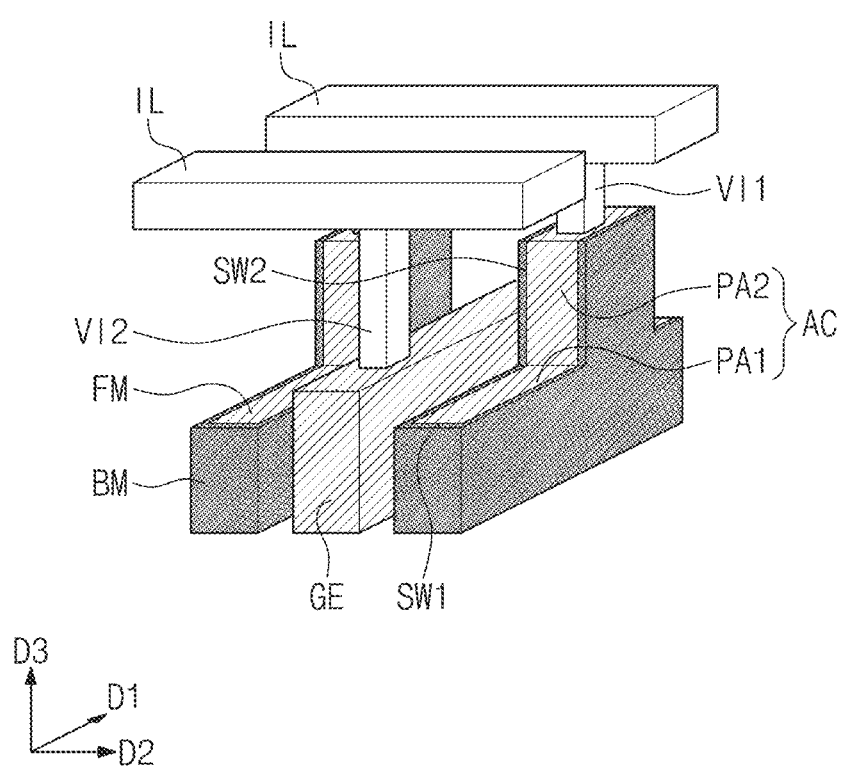
FIG. 3 illustrates a simplified perspective view showing a gate electrode and a pair of active contacts of a semiconductor device according to some example embodiments of the present inventive concepts.

FIG. 1 illustrates a plan view showing a semiconductor device according to some example embodiments of the present inventive concepts. FIGS. 2A, 2B, and 2C illustrate cross-sectional views respectively taken along lines A-A', B-B', and C-C' of FIG. 1. FIG. 3 illustrates a simplified perspective view showing a gate electrode and a pair of active contacts of a semiconductor device according to some example embodiments of the present inventive concepts.

Referring to FIGS. 1, 2A to 2C, and 3, a substrate 100 may include a PMOSFET region PR and an NMOSFET region NR. The substrate 100 may be a compound semiconductor substrate or a semiconductor substrate including silicon, germanium, silicon-germanium, or the like. For example, the substrate 100 may be a silicon substrate.

Each of the PMOSFET and NMOSFET regions PR and NR may be a logic cell region that includes logic transistors constituting a logic circuit of a semiconductor device. For example, the logic cell region of the substrate 100 may include logic transistors constituting a processor core or an I/O terminal. Each of the PMOSFET region PR and the NMOSFET region NR may include at least one of the logic transistors.

The PMOSFET region PR and the NMOSFET region NR may be defined by a second trench TR2 formed on an upper portion of the substrate 100. The second trench TR2 may be positioned between the PMOSFET region PR and the NMOSFET region NR. The PMOSFET region PR and the NMOSFET region NR may be spaced apart in a first direction D1 from each other across the second trench TR2. Each of the PMOSFET region PR and the NMOSFET region NR may extend in a second direction D2 intersecting the first direction D1.

The PMOSFET region PR and the NMOSFET region NR may be provided thereon with a plurality of active patterns AP1 and AP2 that extend in the second direction D2. The active patterns AP1 and AP2 may include first active patterns AP1 on the PMOSFET region PR and second active patterns AP2 on the NMOSFET region NR. The first and second active patterns AP1 and AP2 may be vertically protruding portions of the substrate 100. A first trench TR1 may be defined between neighboring first active patterns AP1 and between neighboring second active patterns AP2.

A device isolation layer ST may fill the first and second trenches TR1 and TR2. The device isolation layer ST may include a dielectric material, such as a silicon oxide layer. The first and second active patterns AP1 and AP2 may have their upper portions that vertically protrude beyond the device isolation layer ST. Each of the upper portions of the first and second active patterns AP1 and AP2 may have a fin shape. The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductive type (e.g., p type). A first channel region CH1 may be interposed between a pair of the first source/drain patterns SD1. Second source/drain patterns SD2 may be provided on the upper portions of the second active patterns AP2. The second source/drain patterns SD2 may be impurity regions having a second conductive type (e.g., n type). A second channel region CH2 may be interposed between a pair of the second source/drain patterns SD2.

The first and second source/drain patterns SD1 and SD2 may be epitaxial patterns formed by a selective epitaxial growth process. The first and second source/drain patterns SD1 and SD2 may have their top surfaces higher than those of the first and second channel regions CH1 and CH2. The first source/drain patterns SD1 may include, for example, a semiconductor element (e.g., SiGe) whose lattice constant is greater than that of a semiconductor element of the substrate 100. The first source/drain patterns SD1 may thus provide the first channel regions CH1 with compressive stress. The second source/drain patterns SD2 may include, for example, the same semiconductor element (e.g., Si) as that of the substrate 100.

Gate electrodes GE may be provided to extend in the first direction D1, while running across the first and second active patterns AP1 and AP2. The gate electrodes GE may be spaced apart from each other in the second direction D2. The gate electrodes GE may vertically overlap the first and second channel regions CH1 and CH2. Each of the gate electrodes GE may surround the top surface and opposite sidewalls of each of the first and second channel regions CH1 and CH2 (see FIG. 2C). The gate electrodes GE may include, for example, one or more of conductive metal nitride (e.g., titanium nitride or tantalum nitride) and metal (e.g., titanium, tantalum, tungsten, copper, or aluminum).

A pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer insulating layer 110 which will be discussed below. The gate spacers GS may include one or more of SiCN, SiCON, and SiN. Alternatively, the gate spacers GS may include a multiple layer consisting of two or more of SiCN, SiCON, and SiN.

Gate dielectric patterns GI may be interposed between the gate electrodes GE and the first active patterns AP1 and between the gate electrodes GE and the second active patterns AP2. Each of the gate dielectric patterns GI may extend along a bottom surface of each of the gate electrodes GE. Each of the gate dielectric patterns GI may cover the top surface and the opposite sidewalls of each of the first and second channel regions CH1 and CH2. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the gate electrodes GE. The gate capping patterns GP may extend in the first direction D1 along the gate electrodes GE. The gate capping patterns GP may include a material having an etch selectivity with respect to first and second interlayer insulating layers 110 and 120 which will be discussed below. For example, the gate capping patterns GP may include one or more of SiON, SiCN, SiCON, and SiN.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface substantially coplanar with those of the gate capping patterns GP and those of the gate spacers GS. The first interlayer insulating layer 110 may be provided thereon with a second interlayer insulating layer 120 covering the gate capping patterns GP. For example, the first and second interlayer insulating layers 110 and 120 may include a silicon oxide layer.

Active contacts AC may be provided to penetrate the first and second interlayer insulating layers 110 and 120 and to have electrical connection with the first and second source/ drain patterns SD1 and SD2. A contact hole CNH may be defined to penetrate the first and second interlayer insulating layers 110 and 120 and to expose one of the first and second source/drain patterns SD1 and SD2. The active contact AC may be disposed in the contact hole CNH. The active contact AC may be placed between a pair of the gate electrodes GE.

A contact spacer CSP may be provided on the contact hole CNH. The contact spacer CSP may conformally cover an inner sidewall of the contact hole CNH. The contact spacer CSP may be interposed between the first interlayer insulating layer 110 and the active contact AC. The contact spacer CSP may include one or more of SiCN, SiCON, and SiN. The contact spacer CSP may include substantially the same material as that of the gate spacer GS.

Each of the active contacts AC may include a barrier pattern BM and a conductive pattern FM. The barrier pattern BM may be interposed between the conductive pattern FM and the contact spacer CSP and between the conductive pattern FM and one of the first and second source/drain patterns SD1 and SD2. The barrier pattern BM may conformally cover opposite sidewalls and a bottom surface of the conductive pattern FM. The barrier pattern BM may not cover a top surface of the conductive pattern FM.

The barrier pattern BM may include a metal nitride layer, for example, one or more of a titanium nitride layer, a tungsten nitride layer, and a tantalum nitride layer. The conductive pattern FM may include a metallic material, for example, one or more of aluminum, copper, tungsten, molybdenum, and cobalt.

Each of the active contacts AC may include a first segment PA1 at a lower portion thereof and a second segment PA2 at an upper portion thereof. The second segment PA2 may be provided on the first segment PA1. The second segment PA2 may protrude in a vertical direction (e.g., a third direction D3) from a top surface of the first segment PA1. The top surface of the first segment PA1 may be lower than that of the gate electrode GE. The second segment PA2 may have a bottom surface lower than the top surface of the gate electrode GE. The second segment PA2 may have a top surface higher than that of the gate electrode GE.

Referring back to FIG. 2B, the first segment PA1 may have a first width W1 in the first direction D1, and the second segment PA2 may have a second width W2 in the first direction D1. The first width W1 may be greater than the second width W2. For example, a maximum width in the first direction D1 of the first segment PA1 may be greater than a maximum width in the first direction D1 of the second segment PA2.

The first width W1 may gradually decrease as approaching a lower portion of the first segment PA1 from an upper portion of the first segment PA1. The first width W1 may decrease as approaching the substrate 100. The second width W2 may gradually increase as approaching a lower portion of the second segment PA2 from an upper portion of the second segment PA2. The second width W2 may increase as approaching the substrate 100.

A liner CAL and an insulating pattern IP may fill a remaining space of the contact hole CNH in which the second segment PA2 is provided. The liner CAL may be formed to conformally cover an upper sidewall of the contact spacer CSP, the top surface of the first segment PA1, and a sidewall of the second segment PA2. The insulating pattern IP may be provided on the liner CAL. For example, the liner CAL may be interposed between the insulating pattern IP and the contact spacer CSP and between the insulating pattern IP and the active contact AC. The insulating pattern IP may have a top surface coplanar with that of the second segment PA2. Each of the liner CAL and the insulating pattern IP may include one or more of SiCN, SiCON, and SiN. Each of the liner CAL and the insulating pattern IP may include a material having an etch selectivity with respect to the gate capping pattern GP.

Referring back to FIGS. 2B and 3, the conductive pattern FM of the first segment PA1 may have a first sidewall SW1, and the conductive pattern FM of the second segment PA2 may have a second sidewall SW2. Each of the first and second sidewalls SW1 and SW2 may be parallel to the second direction D2. For example, each of the first and second sidewalls SW1 and SW2 may be perpendicular to the first direction D1.

The barrier pattern BM may directly cover the first sidewall SW1. The barrier pattern BM may not cover the second sidewall SW2. The second sidewall SW2 may be directly covered with the liner CAL.

Referring back to FIGS. 1 and 2A to 2C, a silicide layer (not shown) may be interposed between the active contact AC and the first source/drain pattern SD1 and/or between the active contact AC and the second source/drain pattern SD2. The active contact AC may be electrically connected through the silicide layer either to the first source/drain pattern SD1 or to the second source/drain pattern SD2. The silicide layer may include metal silicide, for example, one or more of titanium silicide, tantalum silicide, tungsten silicide, nickel silicide, and cobalt silicide.

A third interlayer insulating layer 130 and a fourth interlayer insulating layer 140 may be sequentially provided on the second interlayer insulating layer 120. The third and fourth interlayer insulating layers 130 and 140 may include, for example, a silicon oxide layer. First vias VI1 may be disposed to penetrate the third interlayer insulating layer 130 and to have electrical connection with the active contacts AC. Second vias VI2 may be disposed to penetrate the third interlayer insulating layer 130, the second interlayer insulating layer 120, and the gate capping patterns GP and to have electrical connection with the gate electrodes GE.

The first vias VI1 may be provided on corresponding second segments PA2 of the active contacts AC. The first via VI1 may contact the top surface of the second segment PA2 of the active contact AC. The first via VI1 may vertically overlap the second segment PA2 of the active contact AC.

Each of the second vias VI2 may contact the top surface of the gate electrode GE. The second via VI2 may have a bottom surface higher than the top surface of the first segment PA1 of the active contact AC. The bottom surface of the second via VI2 may be higher than that of the second segment PA2 of the active contact AC. The first and second vias VI1 and VI2 may have their top surfaces coplanar with that of the third interlayer insulating layer 130.

In some example embodiments, at least one second via VI2 may be disposed either on the first active pattern AP1 or on the second active pattern AP2. For example, at least one second via VI2 may vertically overlap either the first or second active pattern AP1 or AP2. The second via VI2 may be adjacent in the second direction D2 to the active contact AC. The following will describe in detail a relationship between the second via VI2 and the active contact AC adjacent thereto.

The first segment PA1 of the active contact AC may be adjacent in the second direction D2 to the second via VI2. The second segment PA2 of the active contact AC may not be adjacent in the second direction D2 to the second via VI2. For example, the second segment PA2 of the active contact AC may not be aligned in the second direction D2 with the second via VI2, but may be offset from the second via VI2.

When viewed in plan, the second segment PA2 of the active contact AC may be spaced apart from the second via VI2 at a minimum spacing distance ML. Therefore, an electrical short may be avoided between the second via VI2 and the second segment PA2 of the active contact AC. In case that the second segment PA2 of the active contact AC is adjacent in the second direction D2 to the second via VI2, an electrical short may occur due to an extremely small distance between the second segment PA2 and the second via VI2.

In addition, as discussed above, the bottom surface of the second via VI2 may be higher than the top surface of the first segment PA1 of the active contact AC. Thus, an electrical short may be avoided (or, alternatively, prevented) between the second via VI2 and the first segment PA1.

The fourth interlayer insulating layer 140 may be provided therein with interconnection lines IL. The interconnection lines IL may extend in parallel along the second direction D2. The interconnection lines IL may be arranged along the first direction D1. The interconnection lines IL may include power lines VDD and VSS.

The interconnection line IL and the active contact AC may be vertically connected to each other by the first via VI1 interposed therebetween. The interconnection line IL and the gate electrode GE may be vertically connected to each other by the second via VI2 interposed therebetween. The interconnection lines IL and the first and second vas VI1 and VI2 may include a metallic material, for example, one or more of aluminum, copper, tungsten, molybdenum, and cobalt.

According to some example embodiments of the present inventive concepts, because an electrical short is avoided between the second via VI2 and the second segment PA2 of the active contact AC, it may be possible that the second vias VI2 are placed on the PMOSFET and NMOSFET regions PR and NR. The second vias VI2 may not be disposed on an area (e.g., the device isolation layer ST filling the second trench TR2) between the PMOSFET and NMOSFET regions PR and NR, and in turn a distance (e.g., a width of the second trench TR2) may be reduced between the PMOSFET and NMOSFET regions PR and NR. In conclusion, a length in the first direction D1 of the logic cell may be reduced to increase integration of a semiconductor device.

FIGS. 4, 6, 8, 10, 12, and 14 illustrate plan views showing a method of manufacturing a semiconductor device according to some example embodiments of the present inventive concepts. FIGS. 5, 7A, 9A, 11A, 13A, and 15A illustrate cross-sectional views taken along line A-A' of FIGS. 4, 6, 8, 10, 12, and 14, respectively. FIGS. 7B, 9B, 11B, 13B, and 15B illustrate cross-sectional views taken along line B-B' of FIGS. 6, 8, 10, 12, and 14, respectively. FIGS. 7C, 9C, 11C, 13C, and 15C illustrate cross-sectional views taken along line C-C' of FIGS. 6, 8, 10, 12, and 14, respectively.

Figure 4:
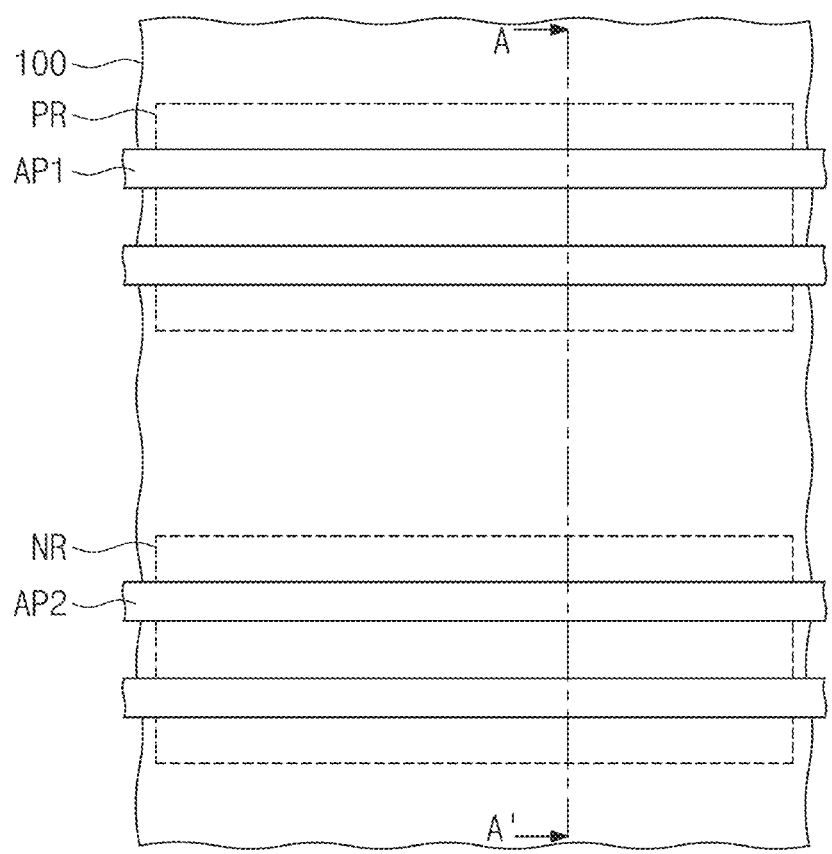
FIGS. 4, 6, 8, 10, 12, and 14 illustrate plan views showing a method of manufacturing a semiconductor device according to some example embodiments of the present inventive concepts.
Figure 4:
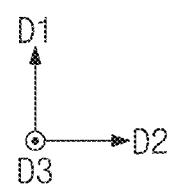
Figure 5:
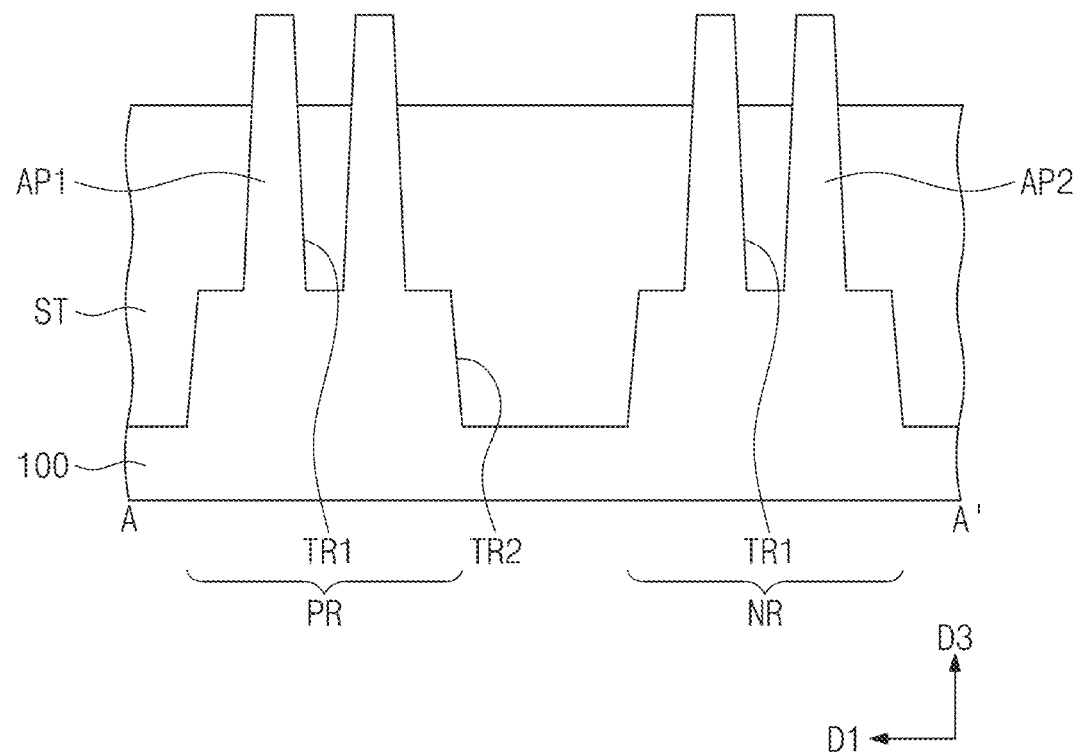
FIGS. 5, 7A, 9A, 11A, 13A, and 15A illustrate cross-sectional views taken along line A-A' of FIGS. 4, 6, 8, 10, 12, and 14, respectively.
Figure 6:
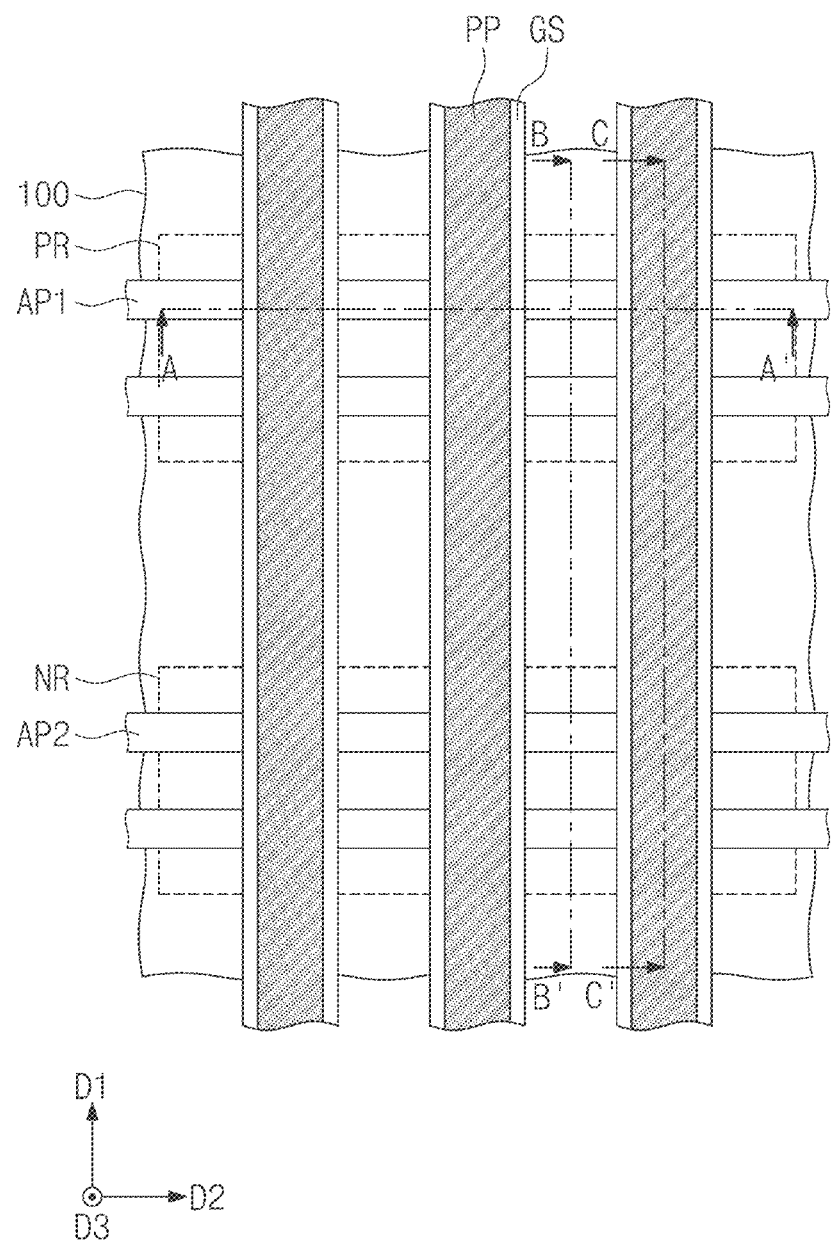
Figure 7A:
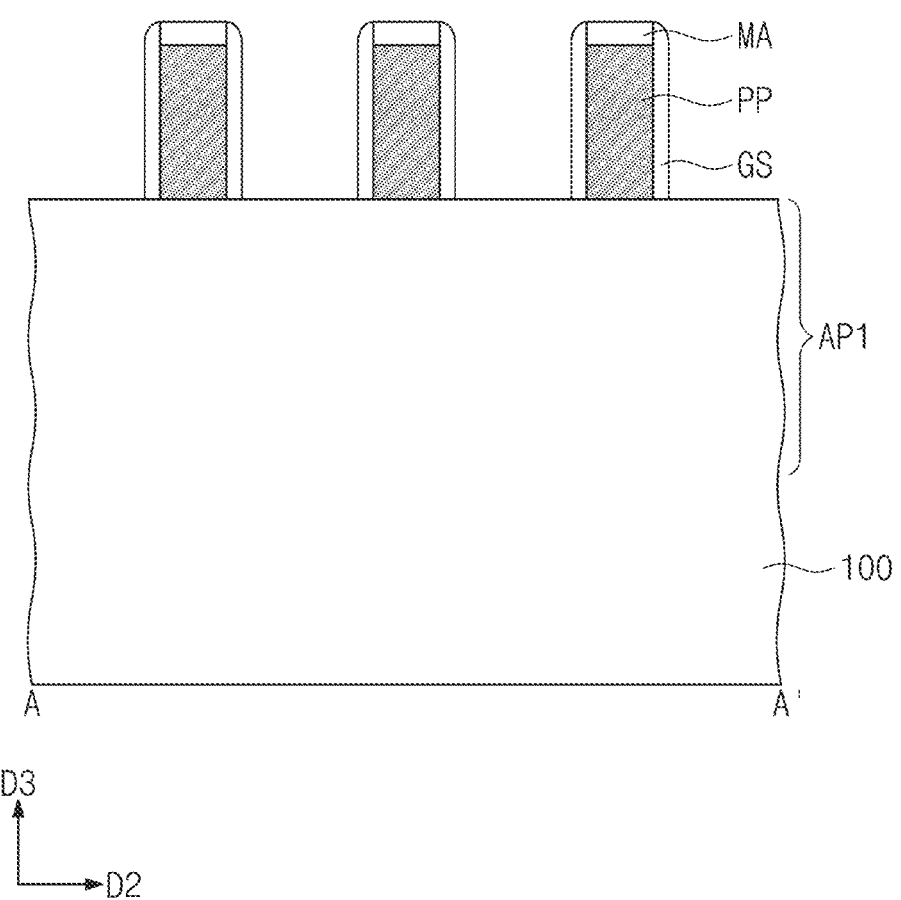
Figure 7B:
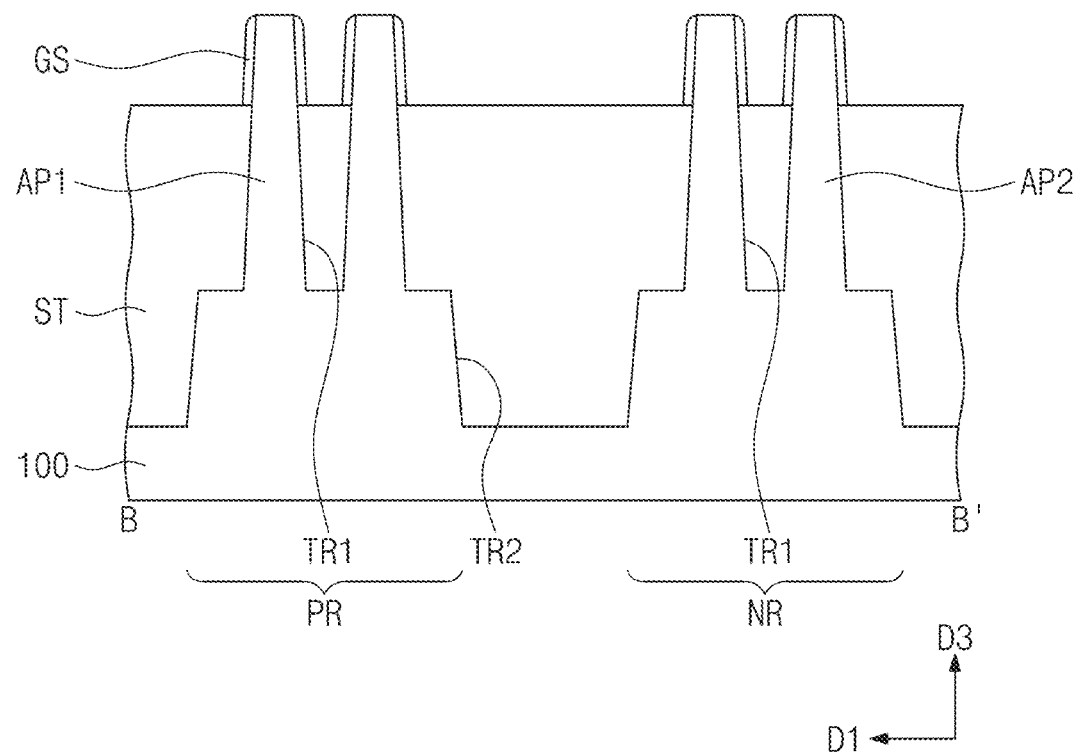
FIGS. 7B, 9B, 11B, 13B, and 15B illustrate cross-sectional views taken along line B-B' of FIGS. 6, 8, 10, 12, and 14, respectively.
Figure 7C:
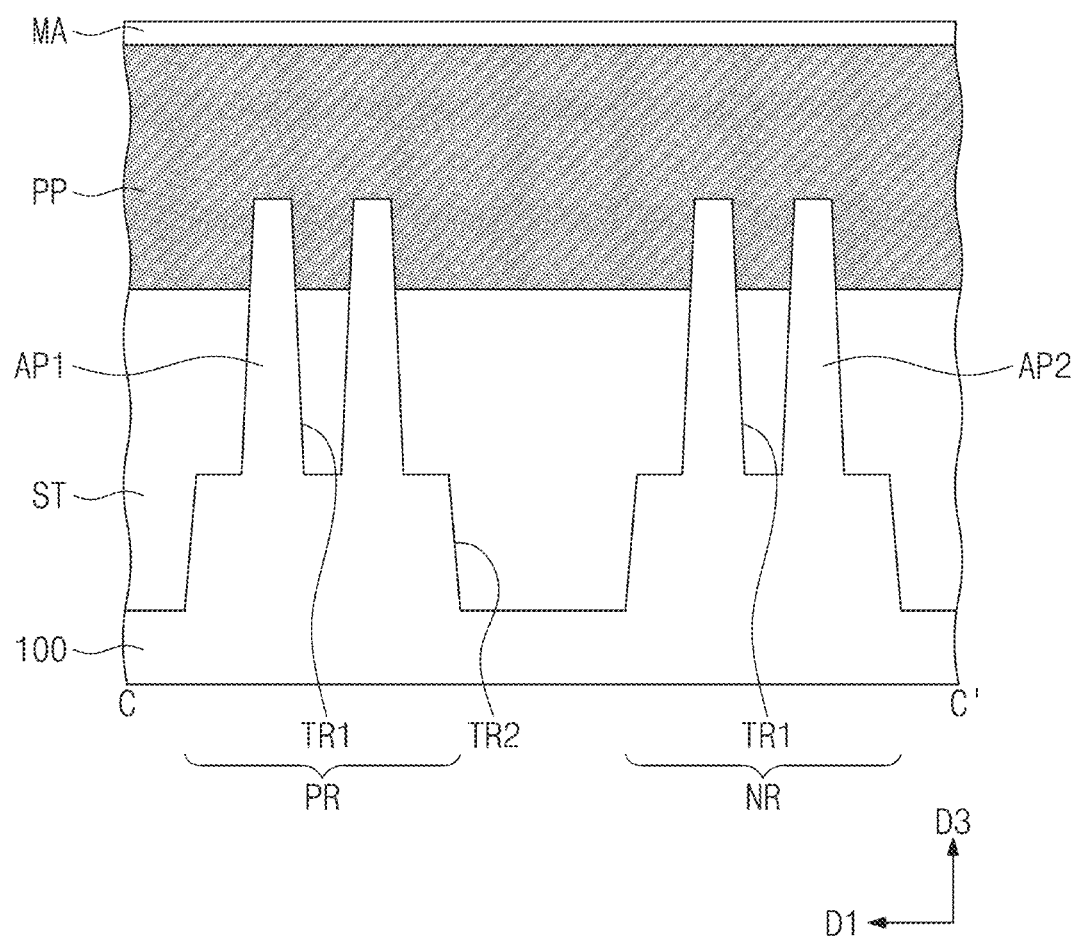
FIGS. 7C, 9C, 11C, 13C, and 15C illustrate cross-sectional views taken along line C-C' of FIGS. 6, 8, 10, 12, and 14, respectively.
Figure 8:
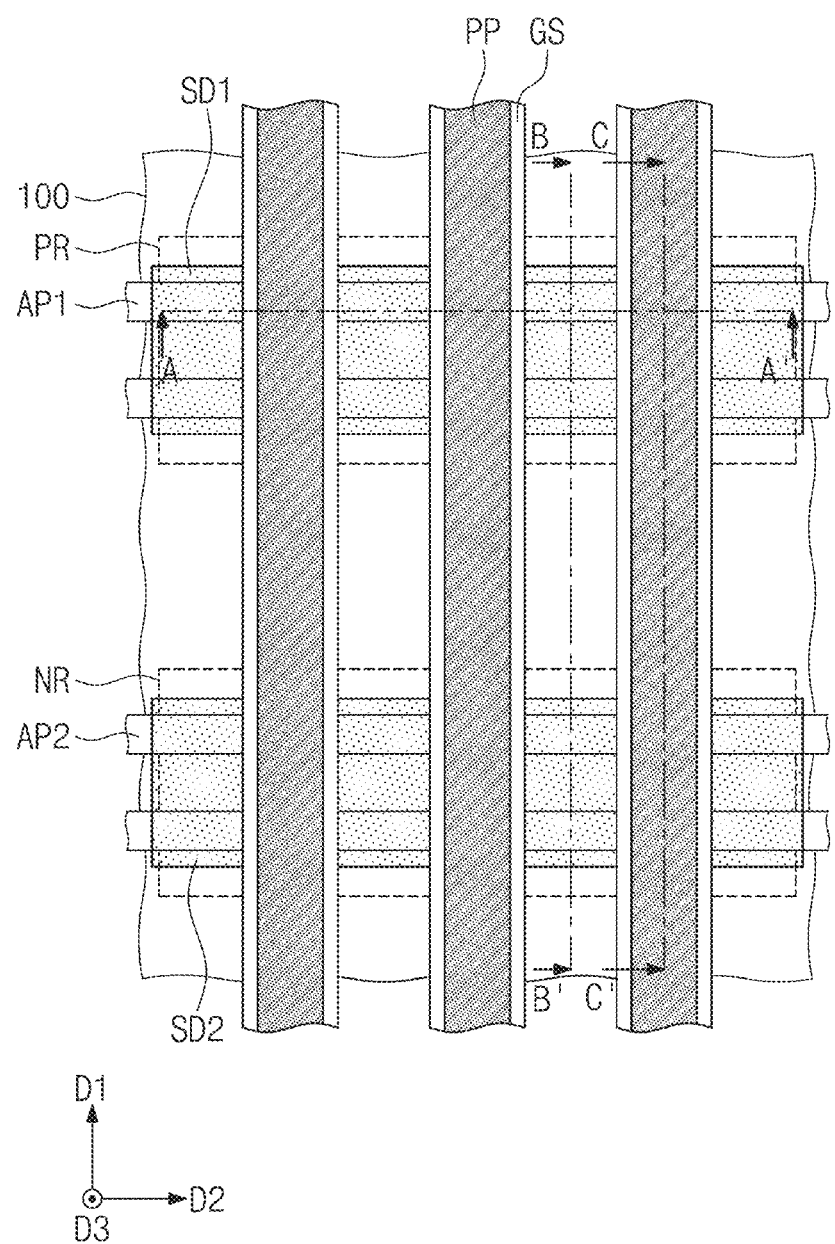
Figure 9A:
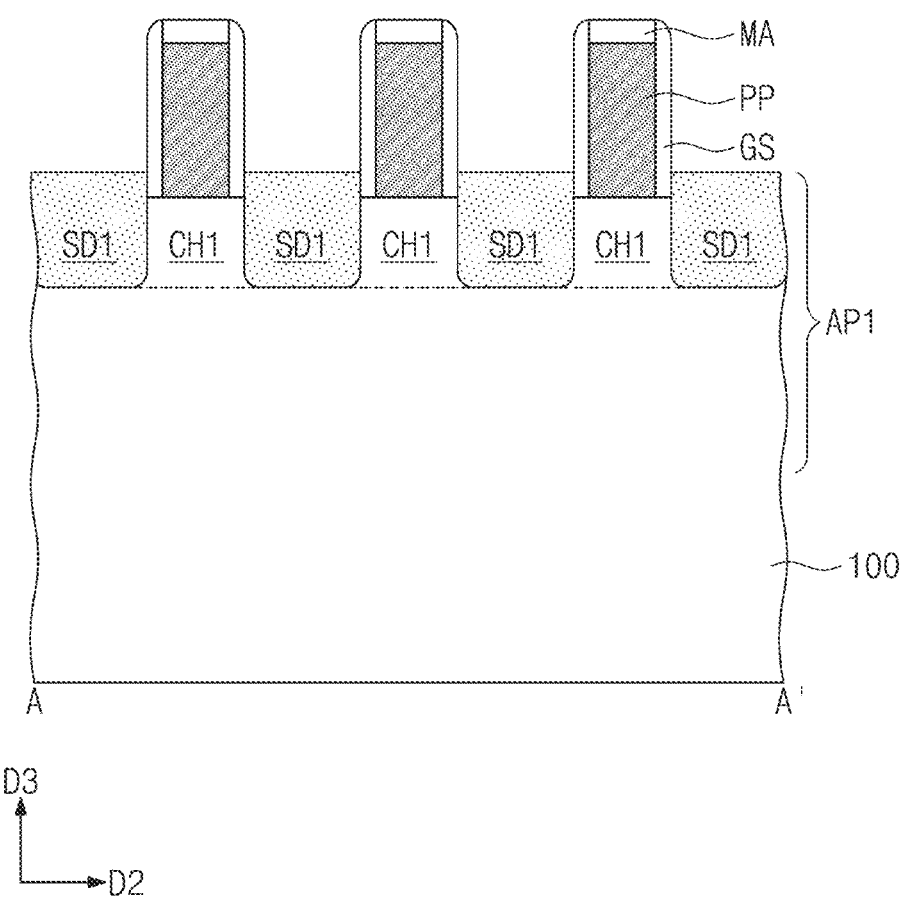
Figure 9B:
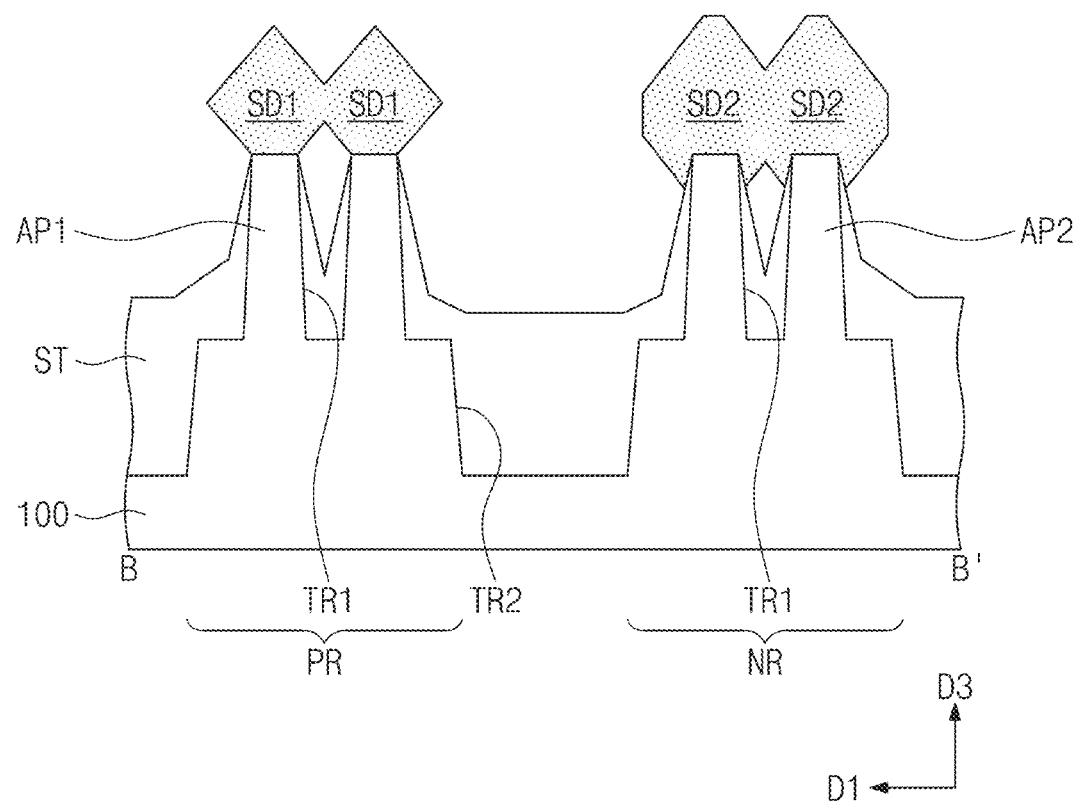
Figure 9C:
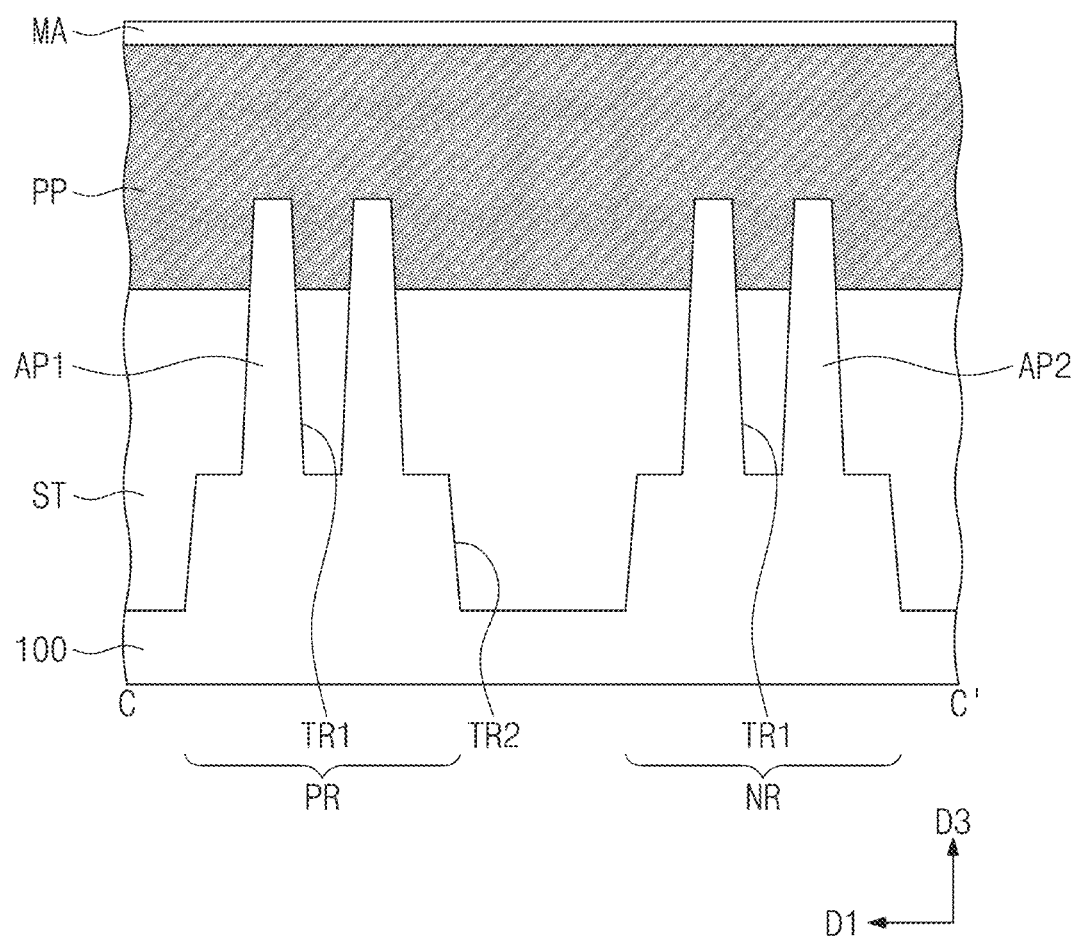
Figure 10:
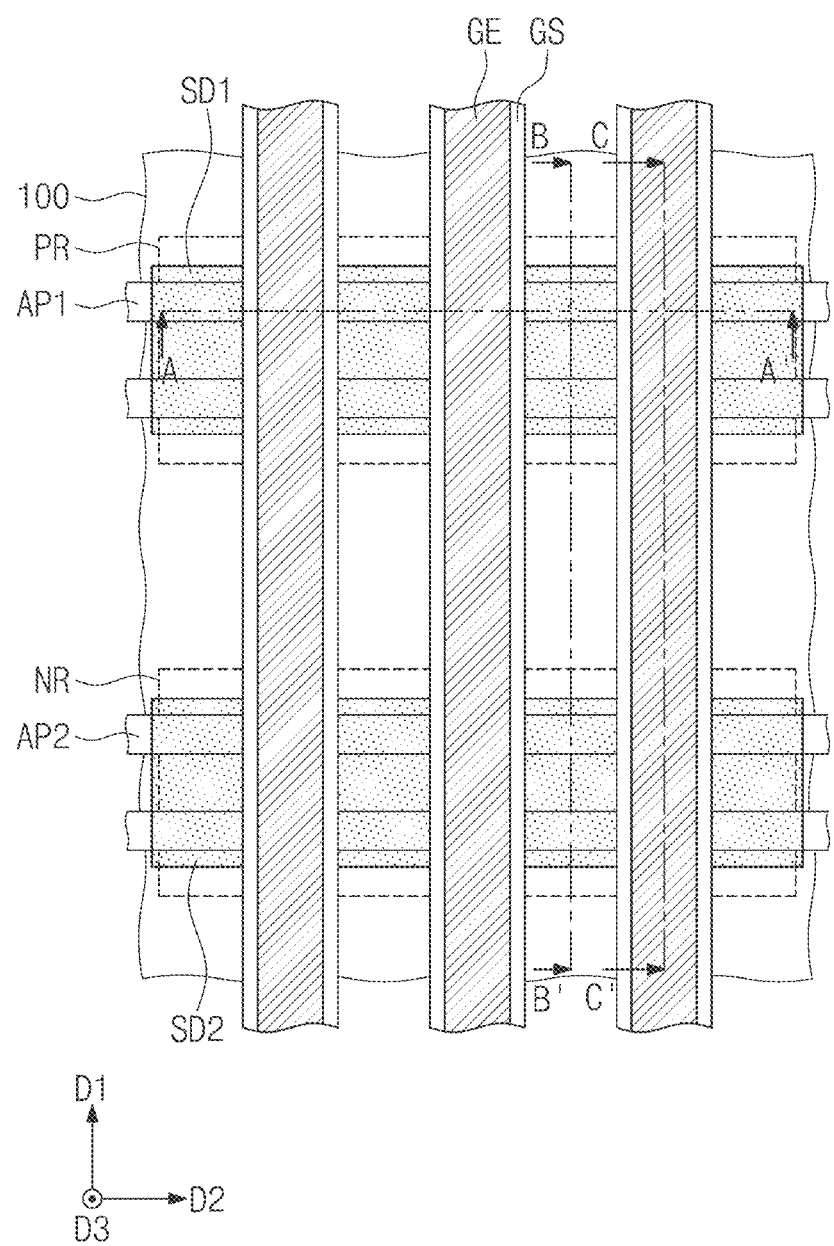
Figure 11A:
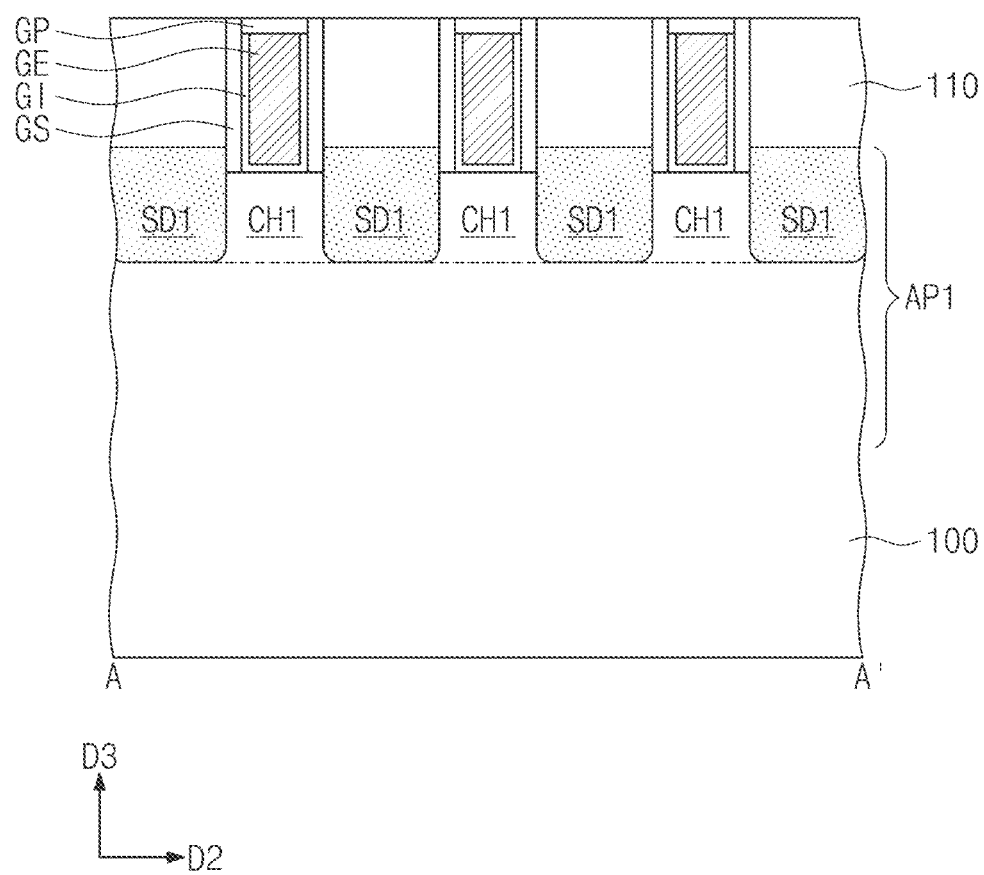
Figure 11B:
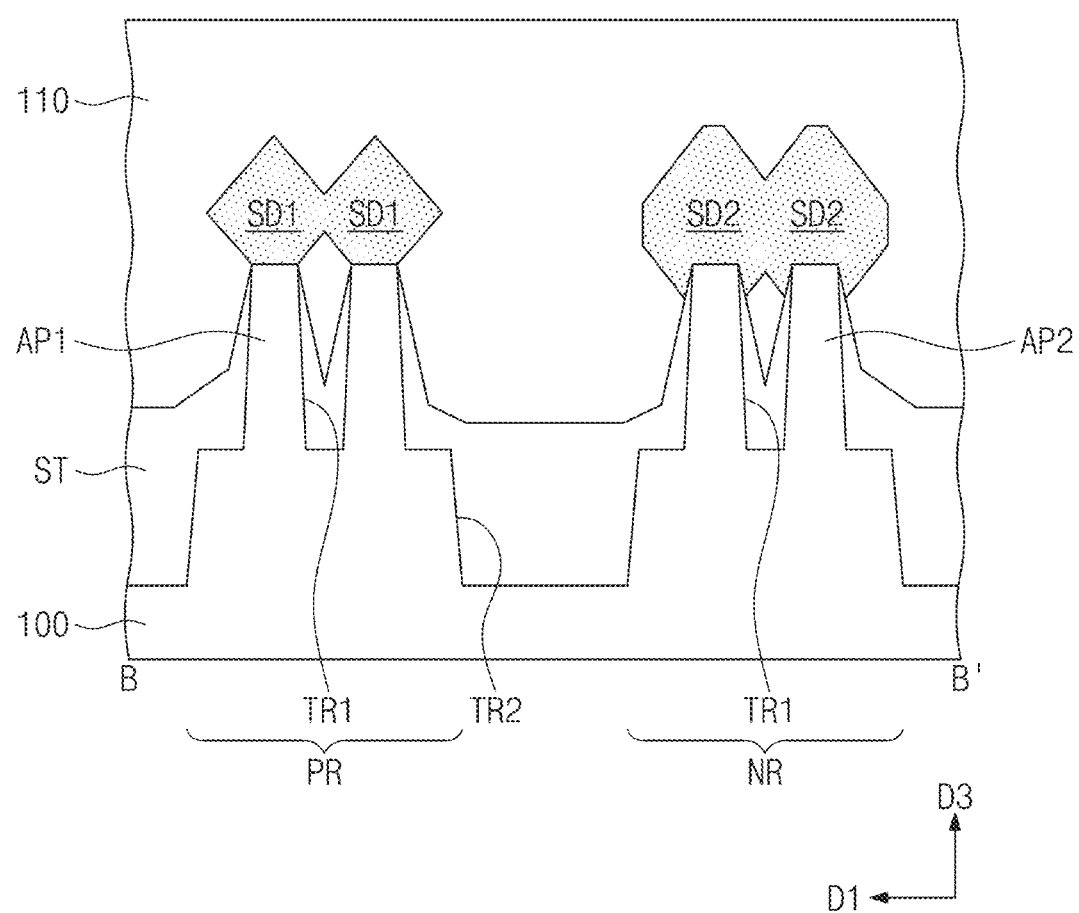
Figure 11C:
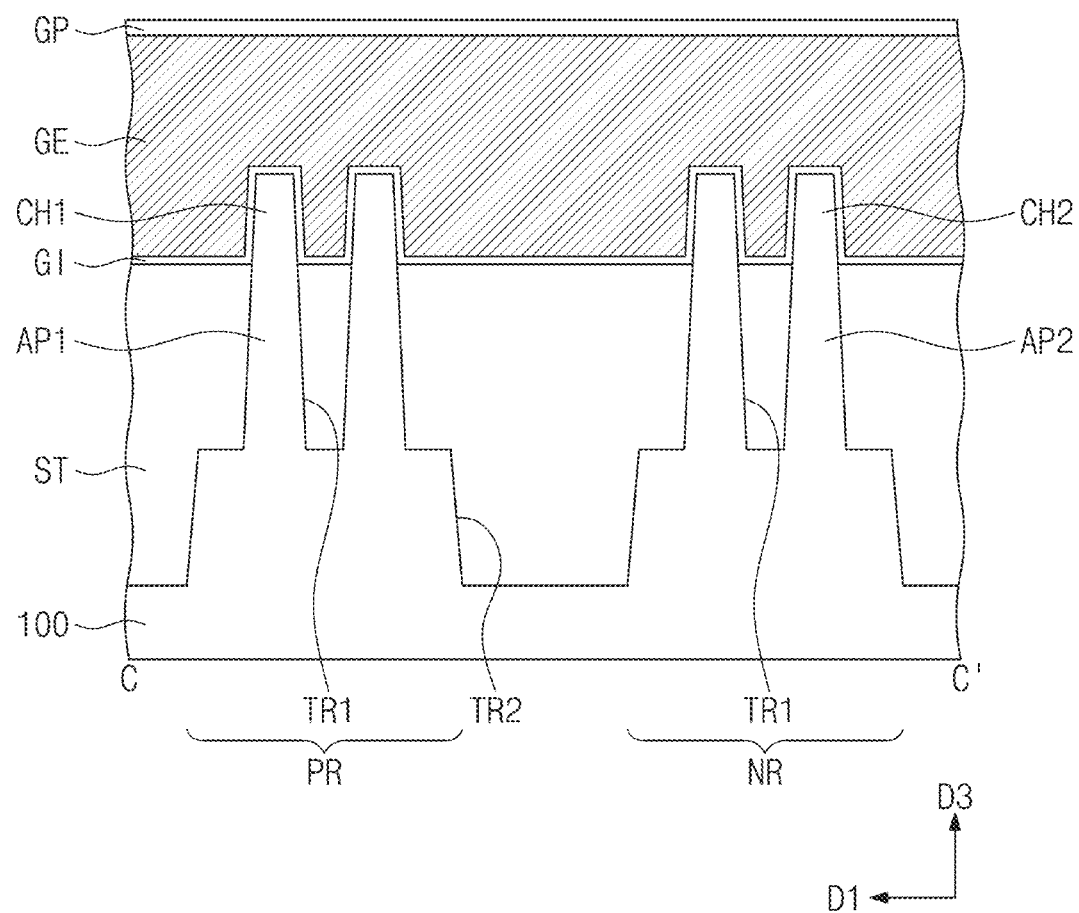
Figure 12:
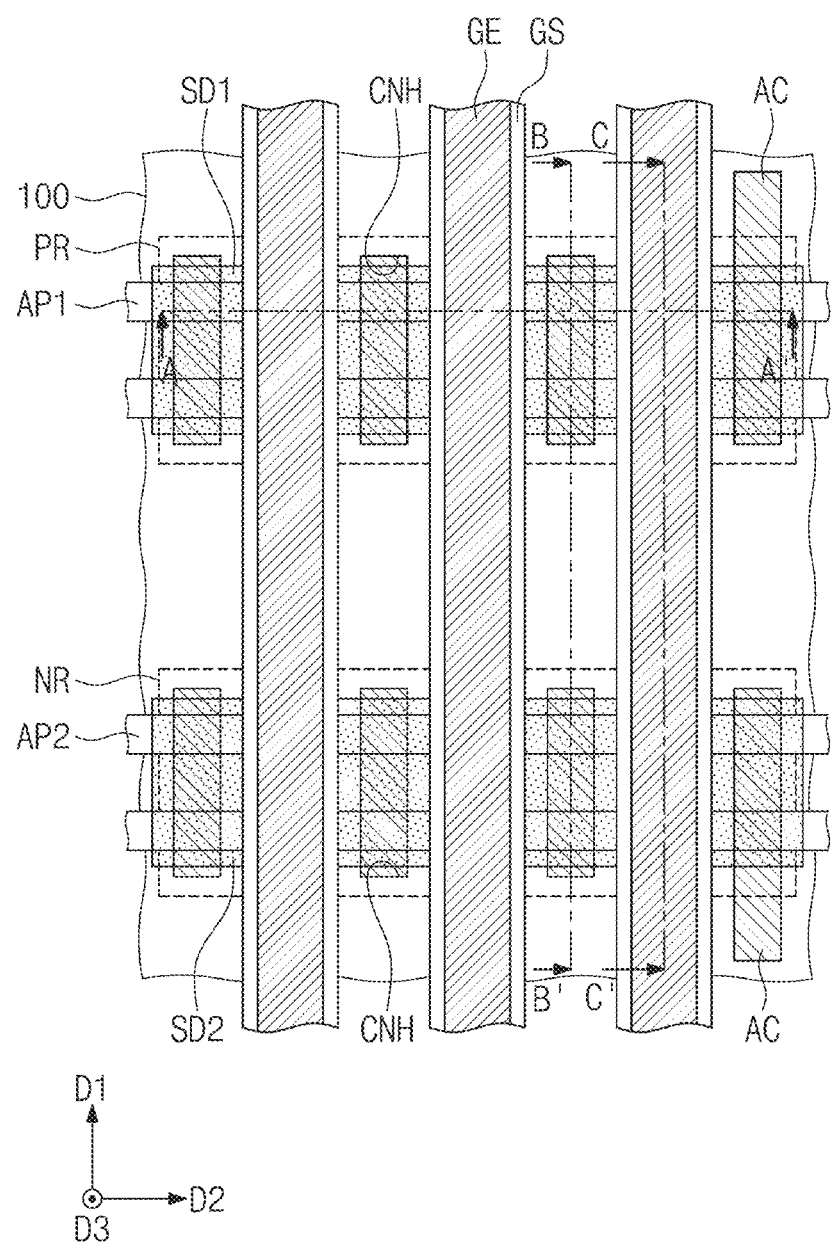
Figure 13A:
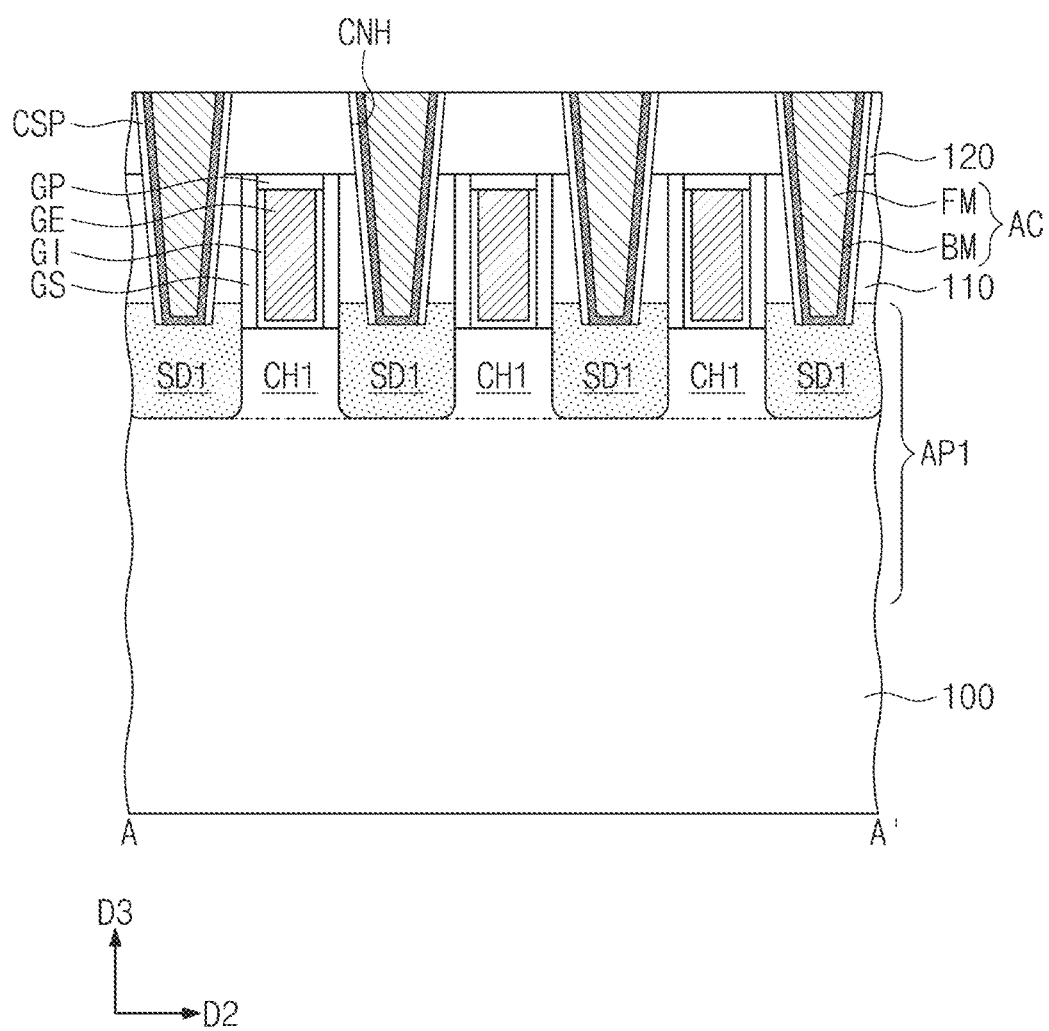
Figure 13B:
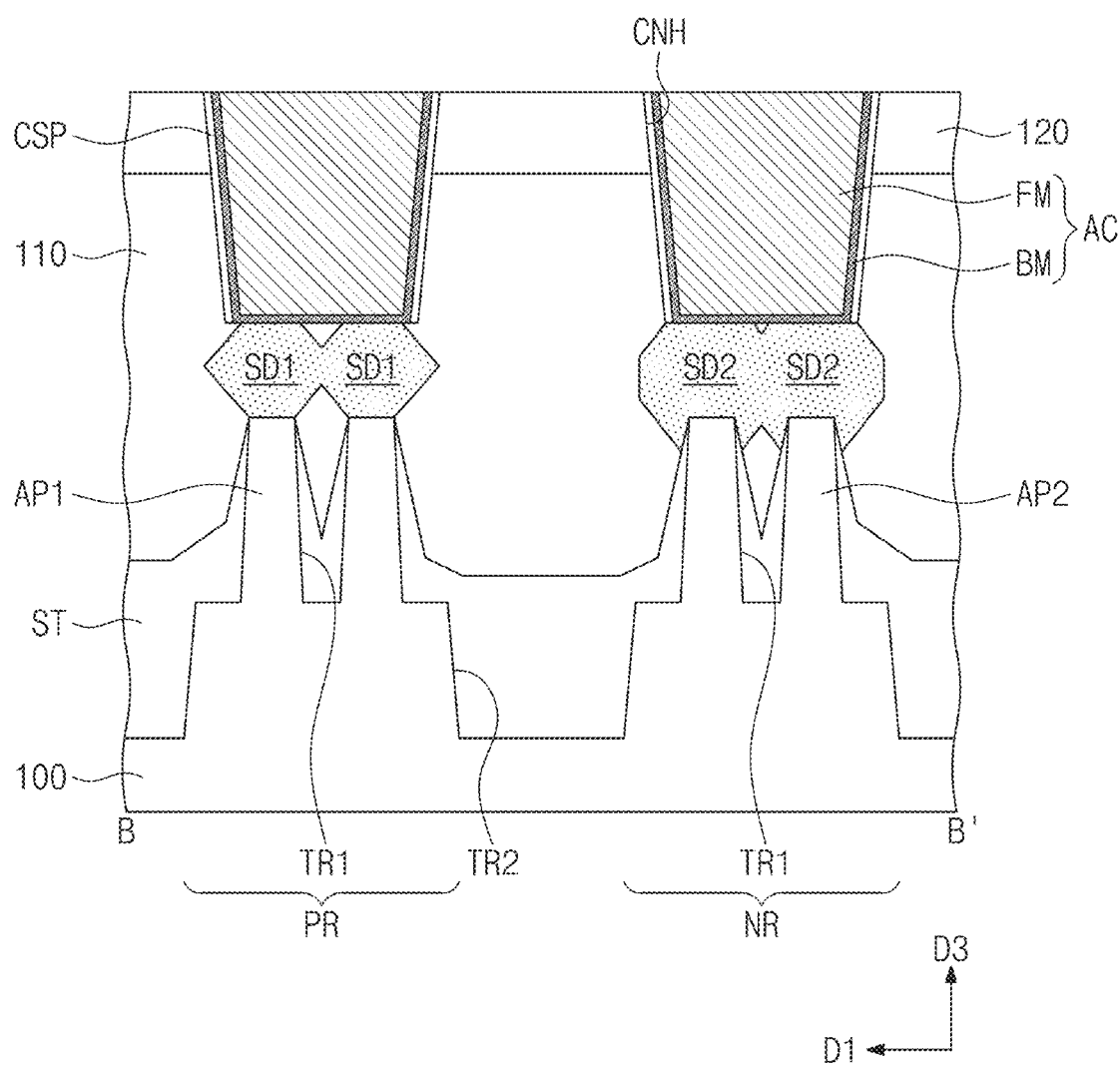
Figure 13C:
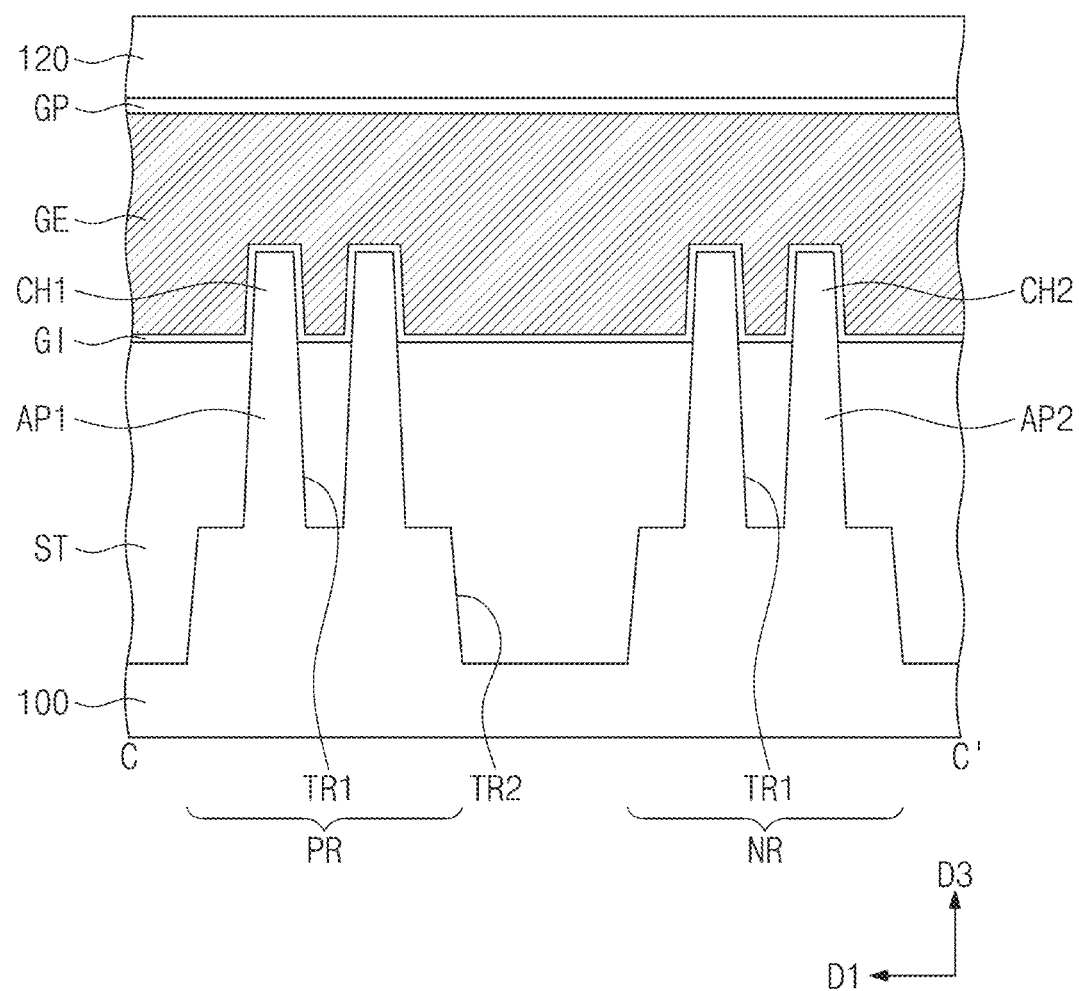
Figure 14:
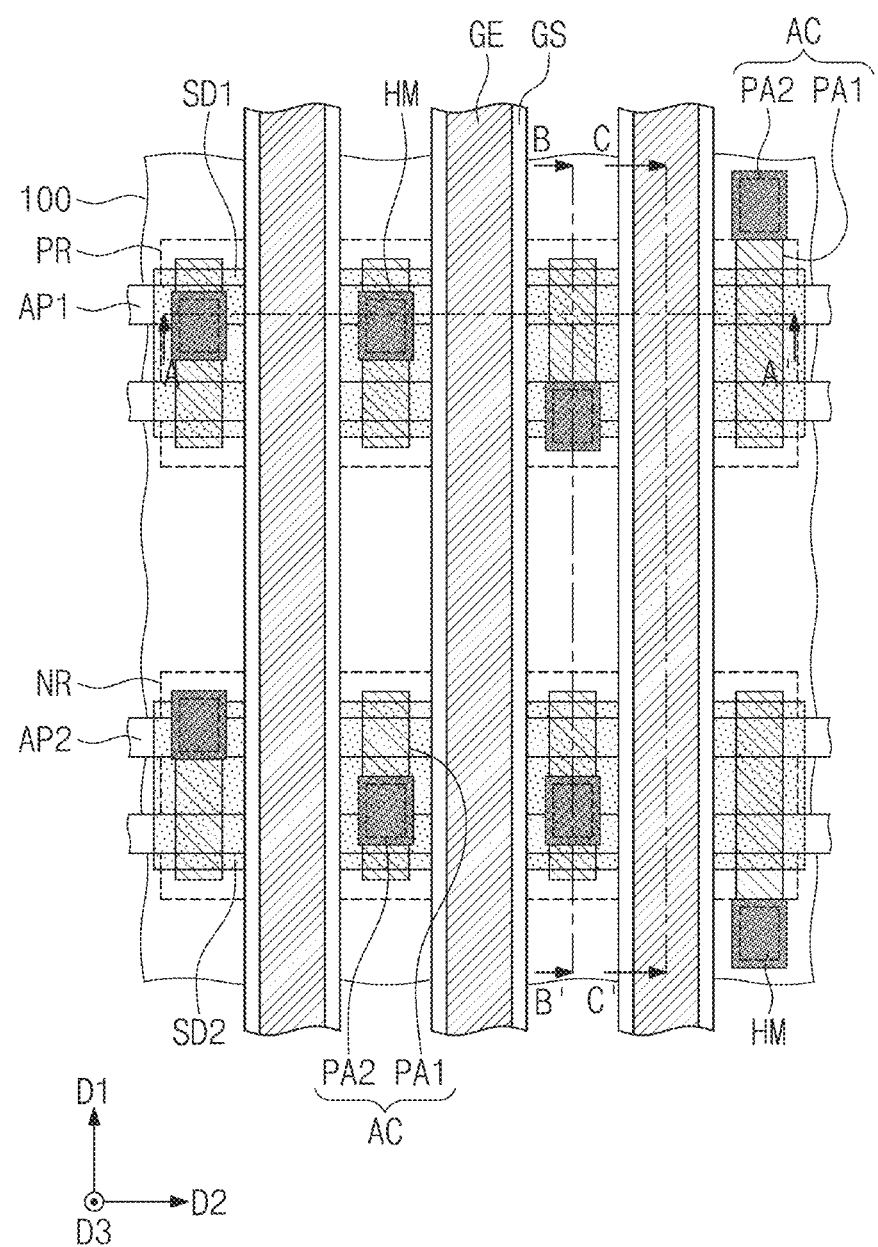
Figure 15A:
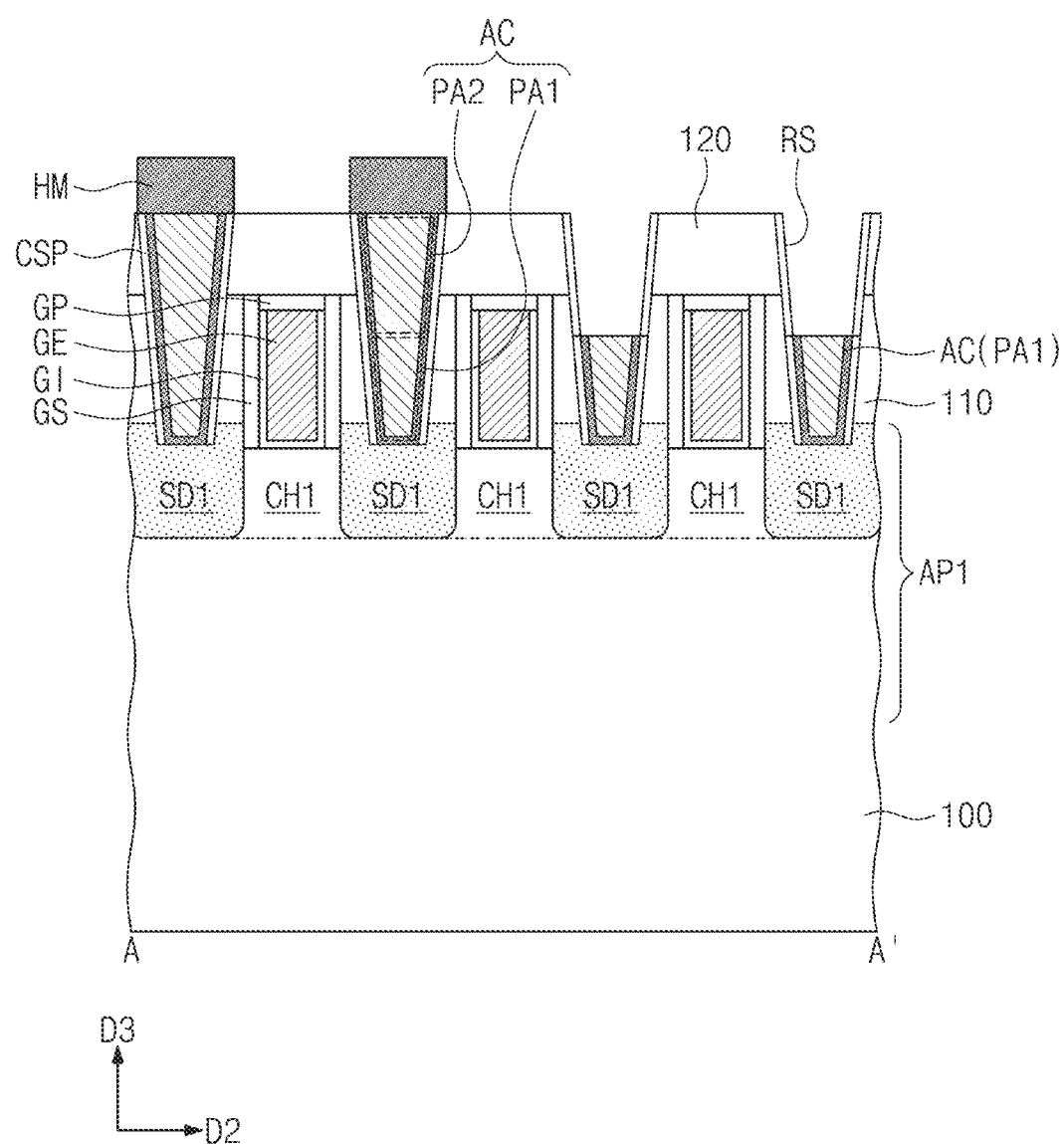
Figure 15B:
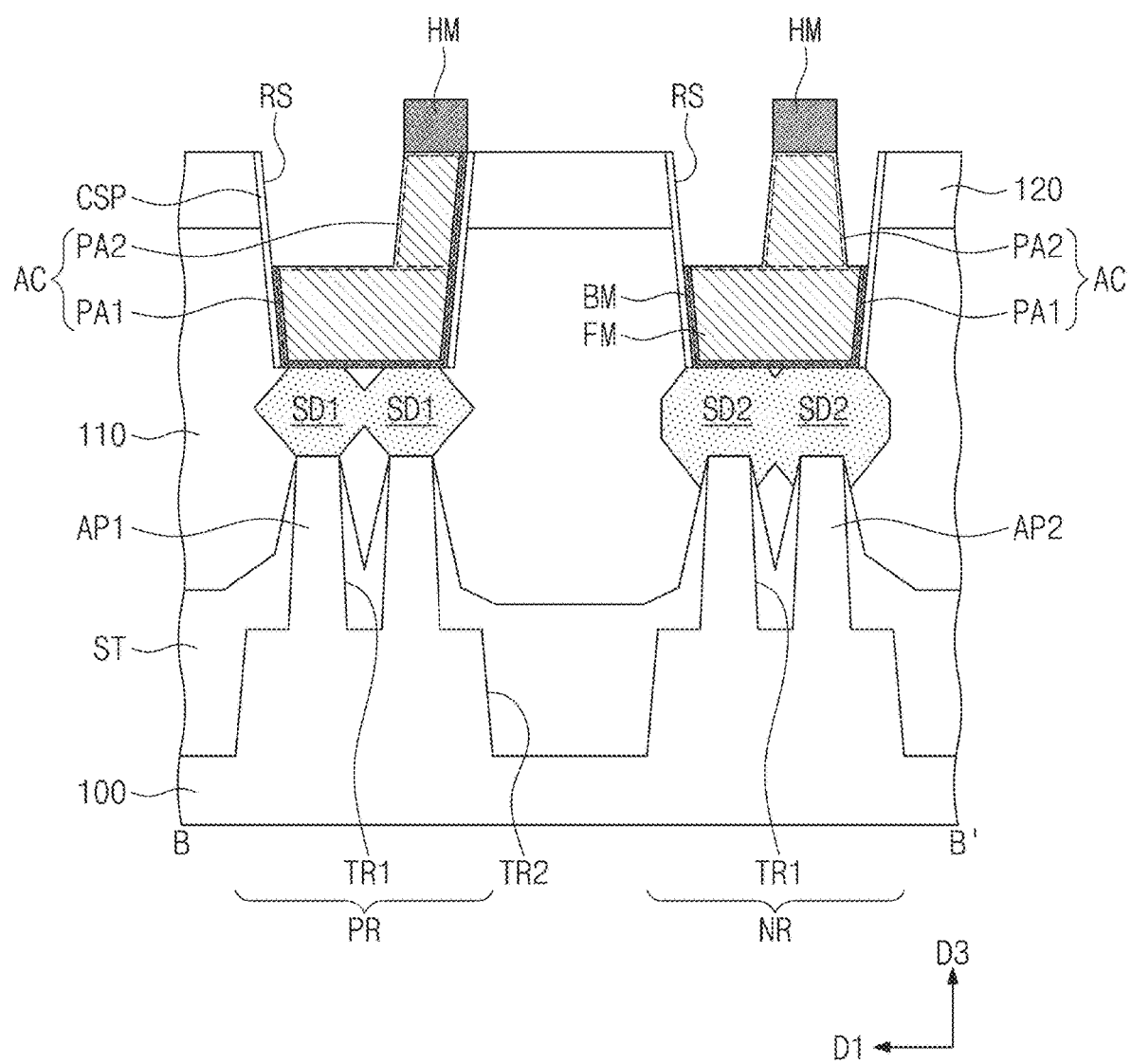
Figure 15C:
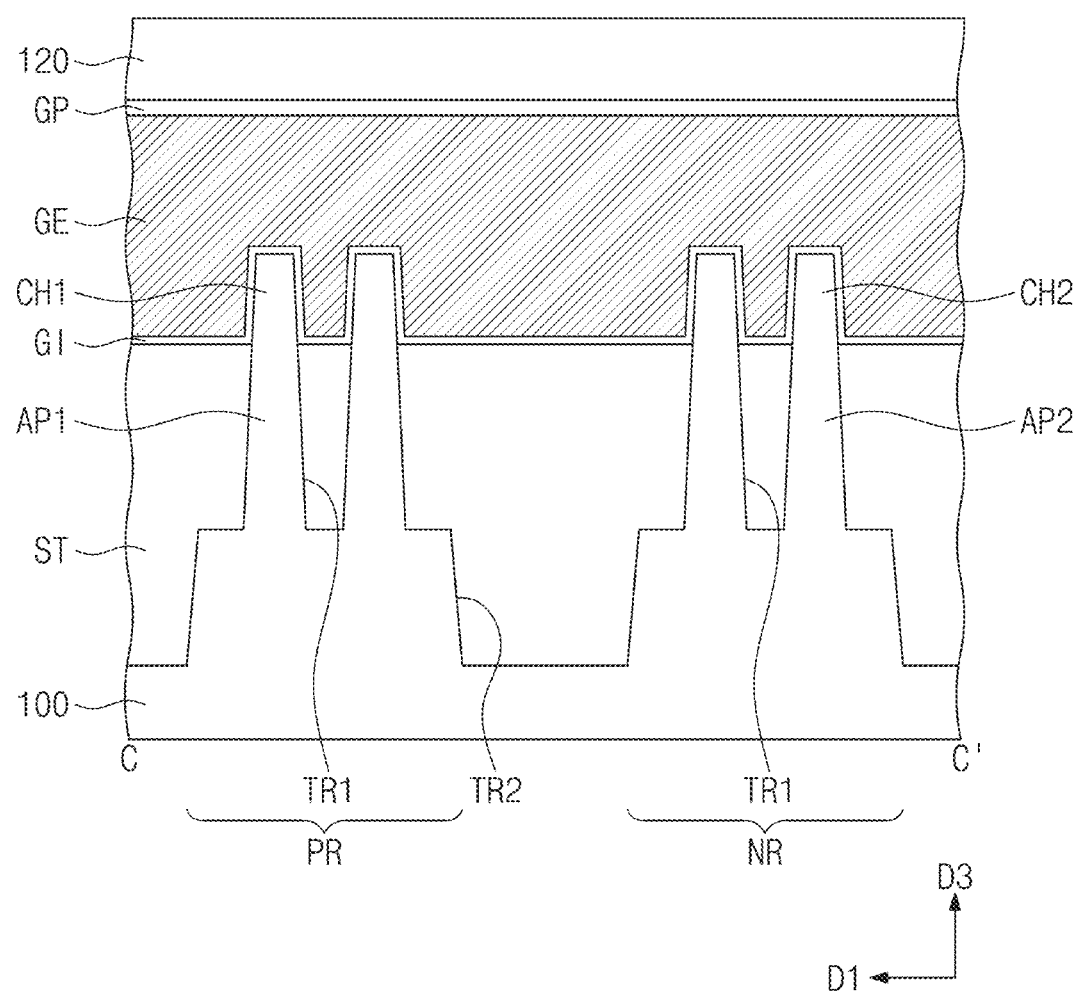

Referring to FIGS. 4 and 5, an upper portion of a substrate 100 may be patterned to form first and second active patterns AP1 and AP2. A first trench TR1 may be formed between the first active patterns AP1 and between the second active patterns AP2. A second trench TR2 may be formed between a PMOSFET region PR on which the first active patterns AP1 are formed and an NMOSFET region NR on which the second active patterns AP2 are formed.

A device isolation layer ST may be formed on the substrate 100, filling the first and second trenches TR1 and TR2. The device isolation layer ST may include a dielectric material, such as a silicon oxide layer. The device isolation layer ST may be recessed until upper portions of the first and second active patterns AP1 and AP2 are exposed. Thus, the upper portions of the first and second active patterns AP1 and AP2 may vertically protrude beyond the device isolation layer ST.

Referring to FIGS. 6 and 7A to 7C, sacrificial patterns PP may be formed to run across the first and second active patterns AP1 and AP2. Each of the sacrificial patterns PP may be formed to have a linear or bar shape extending in a first direction D1. For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include a polysilicon layer.

A pair of gate spacers GS may be formed on opposite sidewalls of each of the sacrificial patterns PP. The gate spacers GS may also be formed on opposite sidewalls of each of the first and second active patterns AP1 and AP2. The opposite sidewalls of each of the first and second active patterns AP1 and AP2 may be exposed portions that not covered with the device isolation layer ST and the sacrificial patterns PP.

The formation of the gate spacers GS may include conformally forming a gate spacer layer on the entire surface of the substrate 100 and anisotropically etching the gate spacer layer. The gate spacer layer may include one or more of SiCN, SiCON, and SiN. Alternatively, the gate spacer layer may be a multiple layer including two or more of SiCN, SiCON, and SiN.

Referring to FIGS. 8 and 9A to 9C, first source/drain patterns SD1 may be formed on the upper portion of each of the first active patterns AP1. The first source/drain patterns SD1 may be formed on opposite sides of each of the sacrificial patterns PP.

For example, the hardmask patterns MA and the gate spacers GS may be used as an etching mask to etch the upper portions of the first active patterns AP1, which may result in the formation of first recesses. When the upper portions of the first active patterns AP1 are etched, the gate spacers GS may also be removed from the opposite sidewalls of each of the first active patterns AP1. When the upper portions of the first active patterns AP1 are etched, the device isolation layer ST may be recessed between the first active patterns AP1.

The first recesses of the first active patterns AP1 may have inner sidewalls that serve as seed layers used for a selective epitaxial growth process to form the first source/drain patterns SD1. The formation of the first source/drain patterns SD1 may define a first channel region CH1 between a pair of the first source/drain patterns SD1. The selective epitaxial growth process may include, for example, chemical vapor deposition (CVD) or molecular beam epitaxy (MBE). The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

When the selective epitaxial growth process is performed to form the first source/drain patterns SD1, impurities may be in-situ implanted. Alternatively, after the first source/drain patterns SD1 are formed, impurities may be implanted into the first source/drain patterns SD1. The first source/drain patterns SD1 may be doped to have a first conductive type (e.g., p type).

Second source/drain patterns SD2 may be formed on the upper portion of each of the second active patterns AP2. The second source/drain patterns SD2 may be formed on opposite sides of each of the sacrificial patterns PP.

For example, the hardmask patterns MA and the gate spacers GS may be used as an etching mask to etch the upper portions of the second active patterns AP2, which may result in the formation of second recesses. The second recesses of the second active patterns AP2 may have inner sidewalls that serve as seed layers used for a selective epitaxial growth process to form the second source/drain patterns SD2. The formation of the second source/drain patterns SD2 may define a second channel region CH2 between a pair of the second source/drain patterns SD2. The second source/drain patterns SD2 may include the same semiconductor element (e.g., Si) as that of the substrate 100. The second source/drain patterns SD1 may be doped to have a second conductive type (e.g., n type).

The first and second source/drain patterns SD1 and SD2 may be sequentially formed by different processes. For example, the first and second source/drain patterns SD1 and SD2 may not be formed at the same time.

Referring to FIGS. 10 and 11A to 11C, a first interlayer insulating layer 110 may be formed to cover the first and second source/drain patterns SD1 and SD2, the hardmask patterns MA, and the gate spacers GS. The first interlayer insulating layer 110 may include, for example, a silicon oxide layer.

The first interlayer insulating layer 110 may be planarized until top surfaces of the sacrificial patterns PP are exposed. An etch-back or chemical mechanical polishing (CMP) process may be used to planarize the first interlayer insulating layer 110. The hardmask patterns MA may all be removed during the planarization process. As a result, the first interlayer insulating layer 110 may have a top surface substantially coplanar with those of the sacrificial patterns PP and those of the gate spacers GS.

The sacrificial patterns PP may be replaced with gate electrodes GE. For example, the exposed sacrificial patterns PP may be selectively removed. The removal of the sacrificial patterns PP may form empty spaces. A gate insulating pattern GI, the gate electrode GE, and a gate capping pattern GP may be formed in each of the empty spaces. The gate insulating pattern GI may be conformally formed to incompletely fill the empty space. The gate insulating pattern GI may be formed by atomic layer deposition (ALD) or chemical oxidation. The gate insulating pattern GI may include, for example, a high-k dielectric material.

The gate electrode GE may be formed by forming a gate electrode layer to completely fill the empty space and planarizing the gate electrode layer. The gate electrode layer may include, for example, one or more of metal and conductive metal nitride.

Thereafter, the gate electrode GE may be recessed at an upper portion thereof. The gate capping pattern GP may be formed on the recessed gate electrode GE. The gate capping pattern GP may include one or more of SiON, SiCN, SiCON, and SiN.

Referring to FIGS. 12 and 13A to 13C, a second interlayer insulating layer 120 may be formed on the first interlayer insulating layer 110. The second interlayer insulating layer 120 may include a silicon oxide layer or a low-k oxide layer. For example, the low-k oxide layer may include a carbon-doped silicon oxide layer such as SiCOH. The second interlayer insulating layer 120 may be formed by chemical vapor deposition (CVD).

Contact holes CNH may be formed to penetrate the second interlayer insulating layer 120 and the first interlayer insulating layer 110, exposing the first and second source/drain patterns SD1 and SD2. Each of the contact holes CNH may be formed between a pair of the gate electrodes GE.

A contact spacer CSP may be formed to cover an inner sidewall of each of the contact holes CNH. The formation of the contact spacer CSP may include conformally forming a contact spacer layer to cover the inner sidewalls of the contact holes CNH and anisotropically etching the contact spacer layer. The contact spacer layer may include one or more of SiCN, SiCON, and SiN.

An active contact AC may be formed to fill the contact hole CNH. The active contact AC may contact the first source/drain pattern SD1 or the second source/drain pattern SD2. The formation of the active contact AC may include forming a barrier pattern BM and a conductive pattern FM that fill the contact hole CNH. For example, a barrier layer may be conformally formed to partially fill the contact holes CNH. A conductive layer may be formed on the barrier layer, completely filling the contact holes CNH. The barrier layer and the conductive layer may be recessed to respectively form the barrier pattern BM and the conductive pattern FM. The barrier layer may include metal nitride, and the conductive layer may include metal.

Referring to FIGS. 14 and 15A to 15C, mask patterns HM may be formed on the active contacts AC. For example, a mask layer may be formed on the substrate 100. A photolithography process may be performed to form a photoresist pattern on the mask layer. The photoresist pattern may be used as an etching mask to pattern the mask layer, which may result in the formation of the mask patterns HM.

The mask patterns HM may be used as an etching mask to selectively etch the active contacts AC. For example, each of the active contacts AC may include a second segment PA2 at an upper portion thereof and a first segment PA1 at a lower portion thereof. The mask pattern HM may be selectively formed on the second segment PA2. The mask pattern HM may be used as an etching mask to etch the active contact AC, with the result that the active contact AC may be removed at its upper portion other than the second segment PA2. A recess RS may be formed when the active contact AC is removed at its upper portion other than the second segment PA2. The recess RS may expose a sidewall of the second segment PA2 and a top surface of the first segment PA1.

The etching of the active contact AC may be achieved by using an etching recipe that can selectively etch metal (e.g., the barrier pattern BM and the conductive pattern FM). Therefore, when the active contact AC is etched, neither the contact spacer CSP nor the second interlayer insulating layer 120 may be etched. When the active contact AC is etched, the mask pattern HM may protect the second segment PA2 of the active contact AC from being etched. The etching of the active contact AC may continue until the top surface of the first segment PA1 of the active contact AC becomes lower than that of the gate electrode GE.

Referring back to FIGS. 1 and 2A to 2C, a liner CAL and an insulating pattern IP may be formed to fill the recess RS. The mask pattern HM may be removed. Each of the liner CAL and the insulating pattern IP may be formed by using one or more of SiCN, SiCON, and SiN.

A third interlayer insulating layer 130 may be formed on the second interlayer insulating layer 120. First vias VI1 may be formed to penetrate the third interlayer insulating layer 130 and to have electrical connection with the active contacts AC. Each of the first vias VI1 may be formed on the second segment PA2 of the active contact AC. For example, each of the first vias VI1 may be formed to vertically overlap the second segment PA2 of the active contact AC. Second vias VI2 may be formed to penetrate the third interlayer insulating layer 130, the second interlayer insulating layer 120, and the gate capping patterns GP and to have electrical connection with the gate electrodes GE.

A fourth interlayer insulating layer 140 may be formed on the third interlayer insulating layer 130. Interconnection lines IL may be formed in the fourth interlayer insulating layer 140. The interconnection lines IL may be electrically connected through the first and second vias VI1 and VI2 to the active contacts AC and the gate electrodes GE.

Figure 16:
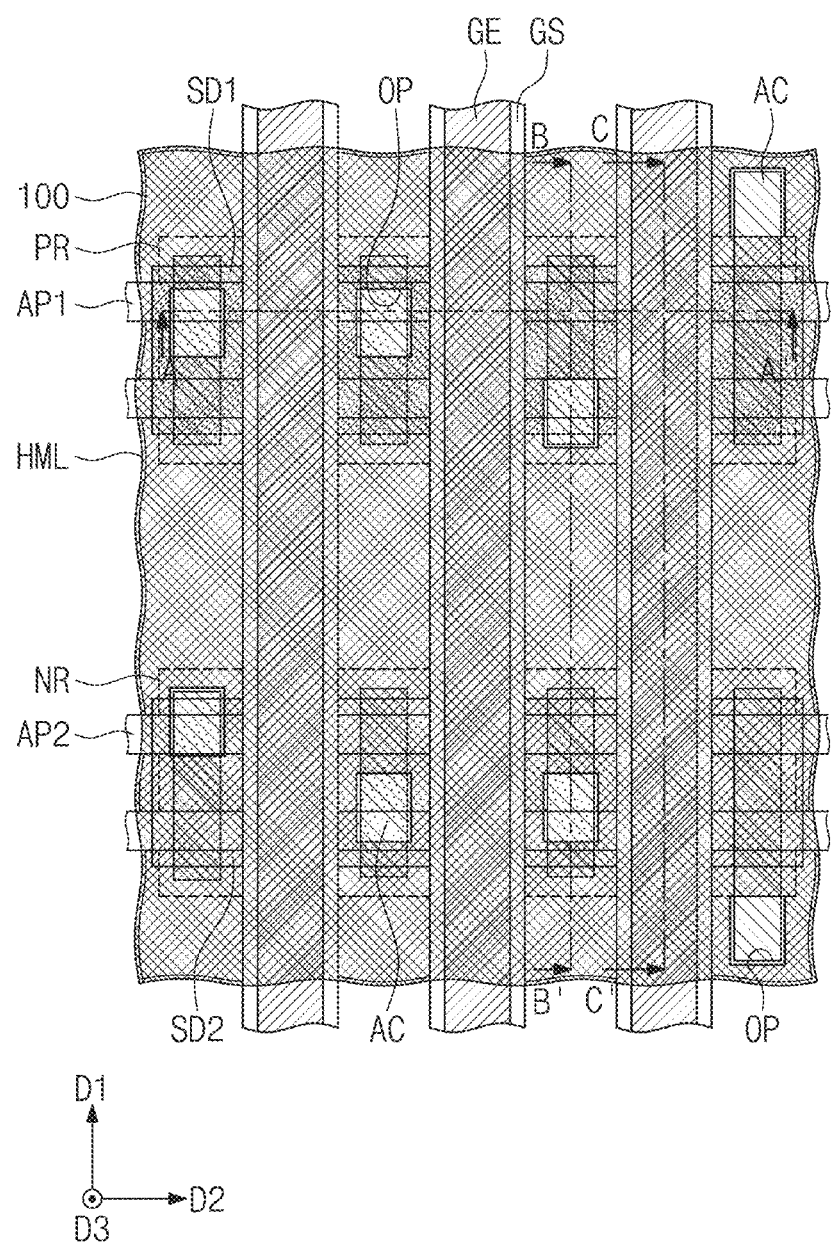
FIG. 16 illustrates a plan view showing a method of manufacturing a semiconductor device according to some example embodiments of the present inventive concepts.
Figure 17A:
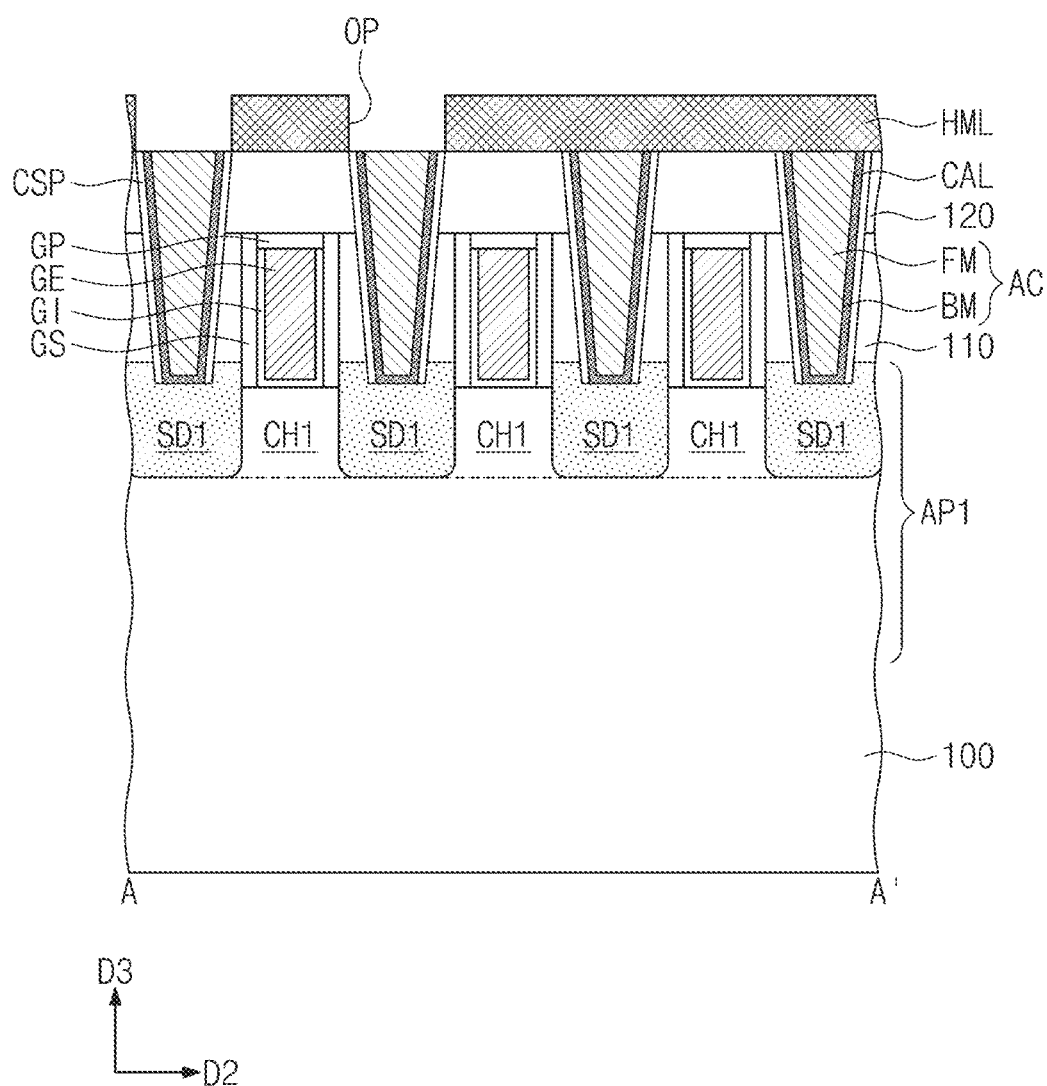
FIGS. 17A, 17B, and 17C illustrate cross-sectional views respectively taken along lines A-A', B-B', and C-C' of FIG. 16.
Figure 17B:
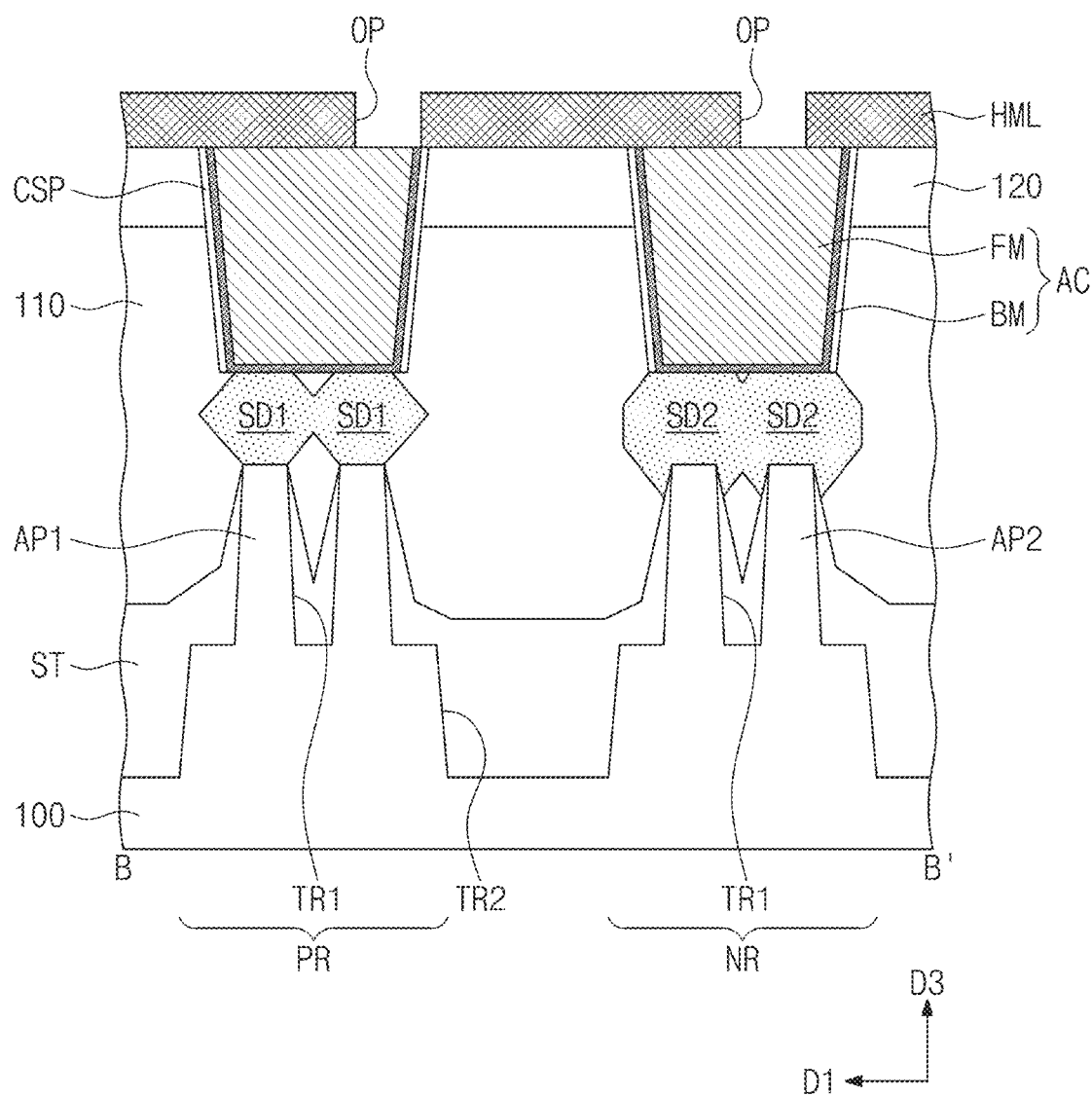
Figure 17C:
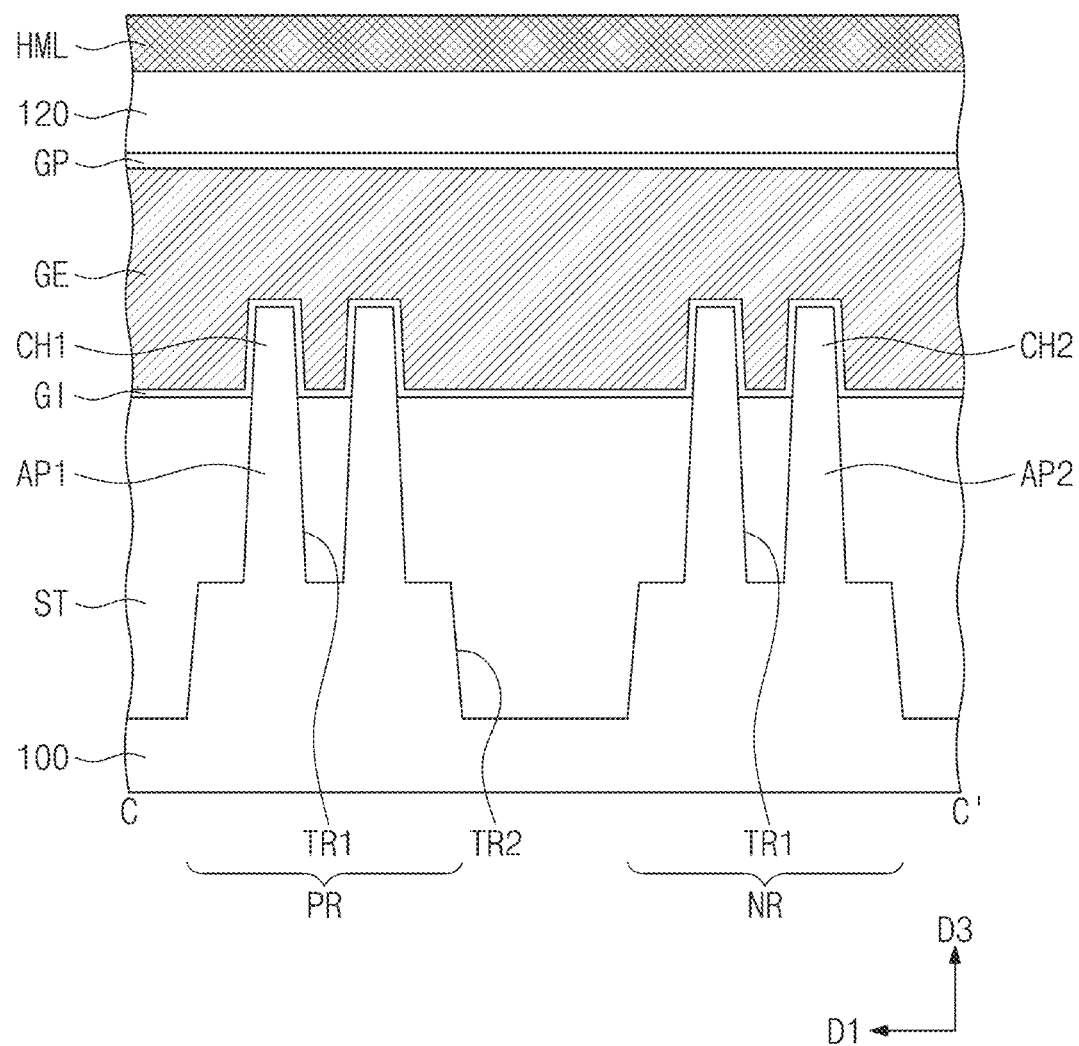

FIG. 16 illustrates a plan view showing a method of manufacturing a semiconductor device according to some example embodiments of the present inventive concepts. FIGS. 17A, 17B, and 17C illustrate cross-sectional views respectively taken along lines A-A', B-B', and C-C' of FIG. 16. In the embodiment that follows, a detailed description of technical features repetitive to those of the manufacturing method discussed above with reference to FIGS. 1 to 15C will be omitted, and a difference thereof will be discussed in detail.

Referring to FIGS. 16 and 17A to 17C, a hardmask layer HML may be formed on a resultant structure of FIGS. 12 and 13A to 13C. The hardmask layer HML may be patterned to form openings OP. Each of the openings OP may partially expose a top surface of the active contact AC. A photolithography process may be performed to pattern the hardmask layer HML.

The openings OP of the hardmask layer HML may be filled with a mask material to form the mask patterns HM that fill the openings OP. Afterward, the hardmask layer HML may be selectively removed (see FIGS. 14 and 15A to 15C).

Figure 18A:
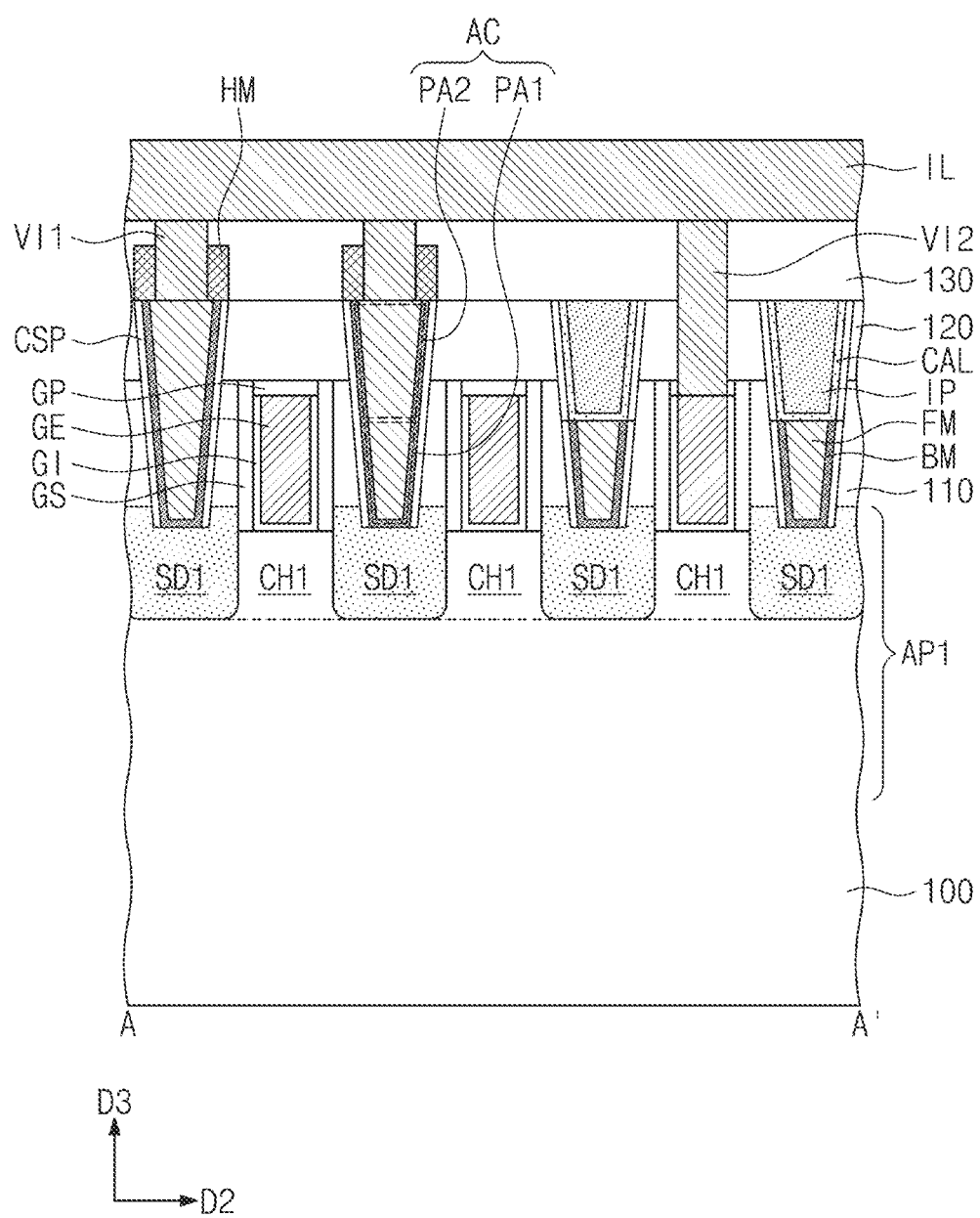
FIGS. 18A and 18B illustrate cross-sectional views respectively taken along lines A-A' and B-B' of FIG. 1, showing a semiconductor device according to some example embodiments of the present inventive concepts.
Figure 18B:
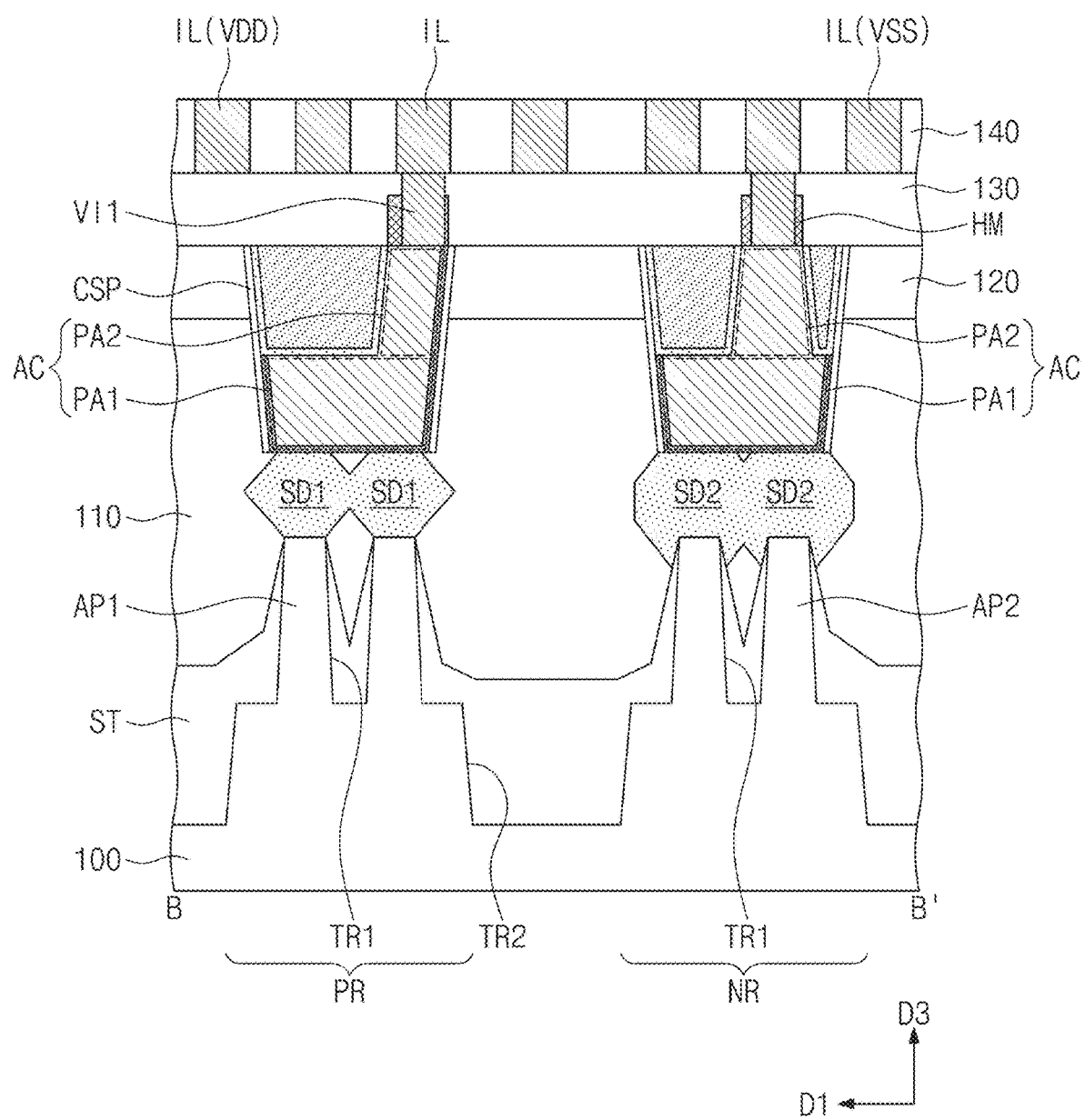

FIGS. 18A and 18B illustrate cross-sectional views respectively taken along lines A-A' and B-B' of FIG. 1, showing a semiconductor device according to some example embodiments of the present inventive concepts. In the embodiment that follows, a detailed description of technical features repetitive to those of the semiconductor device discussed above with reference to FIGS. 1, 2A to 2C, and 3 will be omitted, and a difference thereof will be discussed in detail.

Referring to FIGS. 1, 2C, 18A, and 18B, the mask pattern HM may be provided on the second segment PA2 of the active contact AC. The first via VI1 may penetrate the mask pattern HM and have connection with the second segment PA2 of the active contact AC. The mask patterns HM may not be removed but may remain after the etching of the active contacts AC discussed with reference to FIGS. 14 and 15A to 15C.

Figure 19:
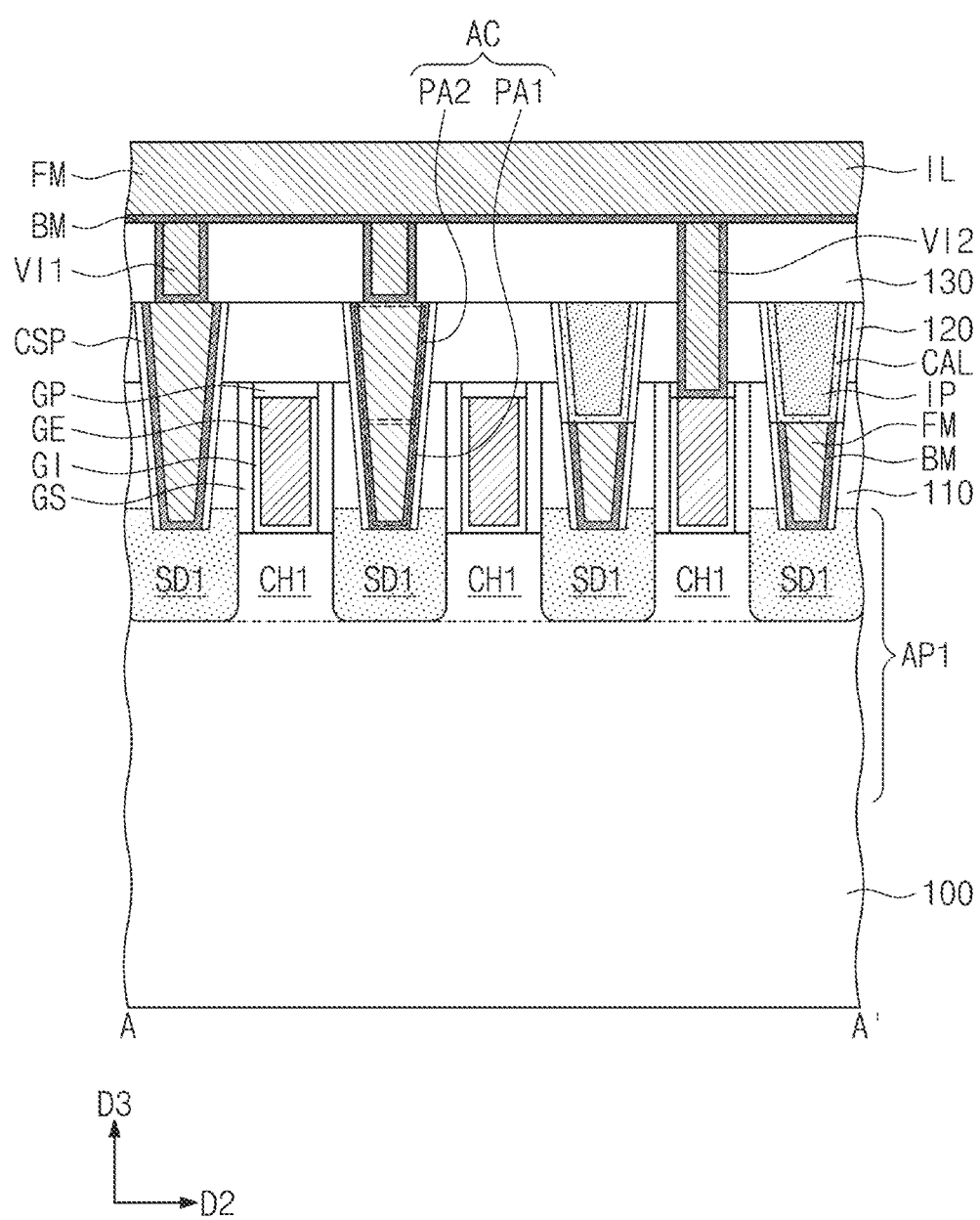
FIG. 19 illustrates a cross-sectional view taken along line A-A' of FIG. 1, showing a semiconductor device according to some example embodiments of the present inventive concepts.

FIG. 19 illustrates a cross-sectional view taken along line A-A' of FIG. 1, showing a semiconductor device according to some example embodiments of the present inventive concepts. In the example embodiment that follows, a detailed description of technical features repetitive to those of the semiconductor device discussed above with reference to FIGS. 1, 2A to 2C, and 3 will be omitted, and a difference thereof will be discussed in detail.

Referring to FIG. 19, each of the first and second vias VI1 and VI2 may include a barrier pattern BM and a conductive pattern FM. Each of the interconnection lines IL may include a barrier pattern BM and a conductive pattern FM. The barrier pattern BM may conformally cover opposite sidewalls and a bottom surface of the conductive pattern FM.

According to the present inventive concepts, a semiconductor device may be configured such that a size of the logic cell is reduced to increase integration of the semiconductor device. The via connected to the gate electrode may be formed offset from an upper portion of the active contact adjacent to the via, and thus an electrical short may be avoided between the via and the active contact and the semiconductor device may increase in reliability.

Although example embodiments of the present inventive concepts have been discussed with reference to accompanying figures, it will be understood that various changes in form and details may be made therein without departing from the spirit and scope of the present inventive concepts. It therefore will be understood that the some example embodiments described above are just illustrative but not limitative in all aspects.

What is claimed is:

1. A semiconductor device, comprising:
a substrate including a first active pattern extending in a first direction;
a gate electrode extending across the first active pattern in a second direction, the second direction intersecting the first direction;
a pair of first source/drain patterns on the first active pattern such that the pair of first source/drain patterns are adjacent to opposite sides of the gate electrode, respectively;
a first active contact on a first one of the pair of first source/drain patterns and a second active contact on a second one of the pair of first source/drain patterns;
a first via on the first active contact and a second via on the second active contact; and
a third via on the gate electrode,
wherein each of the first and second active contacts includes a first segment and a second segment on the first segment, the first segment being connected to corresponding one of the pair of first source/drain patterns, the second segment being connected to corresponding one of the first and second vias,
wherein the second segment of the first active contact and the second segment of the second active contact are aligned along a first imaginary line in the first direction, and
wherein the third via is offset from the first imaginary line in the second direction.

2. The semiconductor device of claim 1, wherein the first via and the second via are aligned along the first imaginary line.

3. The semiconductor device of claim 1, wherein the third via is electrically connected to the gate electrode and vertically overlaps the first active pattern.

4. The semiconductor device of claim 1, further comprising an insulating pattern filling a remaining portion of a contact hole except for corresponding one of the first and second active contacts.

5. The semiconductor device of claim 4, further comprising a contact spacer covering an inner sidewall of the contact hole,
wherein a top surface of the second segment of the corresponding one of the first and second active contacts is coplanar with a top surface of the contact spacer.

6. The semiconductor device of claim 5, wherein the insulating pattern is interposed between the contact spacer and the second segment of the corresponding one of the first and second active contacts.

7. The semiconductor device of claim 1, further comprising:
a second active pattern extending in the first direction and spaced apart from the first active pattern in the second direction, the gate electrode extending from the first active pattern onto the second active pattern;

a pair of second source/drain patterns on the second active pattern such that the pair of second source/drain patterns are adjacent to opposite sides of the gate electrode, respectively;

a third active contact on a first one of the pair of second source/drain patterns and a fourth active contact on a second one of the pair of second source/drain patterns; and a fourth via on the third active contact and a fifth via on the fourth active contact, wherein a second imaginary line extends from the fourth via in the first direction, and wherein the fifth via is offset from the second imaginary line in the second direction.

8. The semiconductor device of claim 1, wherein a top surface of the first segment of each of the first and second active contacts is lower than a top surface of the gate electrode relative to the substrate.

9. The semiconductor device of claim 1, wherein
the first via vertically overlaps the second segment of the first active contact, and
wherein the second via vertically overlaps the second segment of the second active contact.

10. The semiconductor device of claim 1, further comprising:
a first interconnection line on the first via, the first interconnection line being electrically connected to the source/drain pattern through the first via and the active contact; and
a second interconnection line on the third via, the second interconnection line being electrically connected to the gate electrode through the third via,
wherein the first interconnection line and the second interconnection line extend in parallel along the first direction.

11. A semiconductor device, comprising:
a substrate including a first active pattern and a second active pattern that extend in parallel along a first direction and are spaced apart from each other in a second direction, the second direction intersecting the first direction;
a gate electrode extending in the second direction from the first active pattern to the second active pattern;
a first source/drain pattern on the first active pattern and a second source/drain pattern on the second active pattern such that the first and second source/drain patterns are adjacent to a side of the gate electrode;
a first active contact on the first source/drain pattern and a second active contact on the second source/drain pattern;
a first contact spacer on a sidewall of the first active contact and a second contact spacer on a sidewall of the second active contact; and
a first via on the first active contact and a second via on the second active contact, wherein each of the first and second active contacts is provided in a contact hole and includes:
a first segment in a lower portion of the contact hole; and
a second segment vertically protruding from the first segment and being in an upper portion of the contact hole,
wherein the first and second segments of the first active contact are in contact with the first contact spacer, wherein the first segment of the second active contact is in contact with the second contact spacer, and
wherein the second segment of the second active contact is spaced apart from the contact spacer.

12. The semiconductor device of claim 11, further comprising:
an insulating pattern between the second segment of the second active contact and the second contact spacer.

13. The semiconductor device of claim 11, wherein sidewalls of the first and second segments of the first active contact are aligned with each other along the first contact spacer.

14. The semiconductor device of claim 11, wherein a first width of the first segment of each of the first and second active contacts is greater than a second width of the second segment of each of the first and second active contacts.

15. The semiconductor device of claim 11, wherein
the first via vertically overlaps the second segment of the first active contact, and
wherein the second via vertically overlaps the second segment of the second active contact.

16. A semiconductor device, comprising:
a substrate including a first active region and a second active region that extend in a first direction and are spaced apart from each other in a second direction, the second direction intersecting the first direction;
a gate electrode extending from the first active region to the second active region in the second direction;
a first active contact and a second active contact that are on the first active region;
a third active contact and a fourth active contact that are on the second active region;
first, second, third and fourth vias on the first, second, third and fourth active contacts, respectively;
a fifth via on the first active region and electrically connected to the gate electrode,
wherein each of the first and second active contacts is provided in a contact hole and includes:
a first segment in a lower portion of the contact hole; and
a second segment vertically protruding from the first segment and being in an upper portion of the contact hole,
wherein the second segment of the first active contact and the second segment of the second active contact are aligned along a first imaginary line in the first direction,
wherein a second imaginary line extends from the second segment of the third active contact, and
wherein the second segment of the fourth active contact is offset from the second imaginary line in the second direction.

17. The semiconductor device of claim 16, wherein the fifth via is offset from the first imaginary line in the second direction.

18. The semiconductor device of claim 16, wherein the first, second, third and fourth vias are connected to the second segments of the first, second, third and fourth active contacts, respectively.

19. The semiconductor device of claim 16, wherein the first via and the second via are aligned along the first imaginary line.

20. The semiconductor device of claim 16, wherein the fourth via is offset from the second imaginary line in the second direction.

* * * * *